United States Patent
Saruki et al.

(10) Patent No.: US 11,693,067 B2
(45) Date of Patent: *Jul. 4, 2023

(54) MAGNETIC SENSOR SYSTEM

(71) Applicant: TDK CORPORATION, Tokyo (JP)

(72) Inventors: Shunji Saruki, Tokyo (JP); Shinichirou Mochizuki, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/564,733

(22) Filed: Dec. 29, 2021

(65) Prior Publication Data

US 2022/0120829 A1 Apr. 21, 2022

Related U.S. Application Data

(63) Continuation of application No. 16/744,359, filed on Jan. 16, 2020, now Pat. No. 11,243,274.

(30) Foreign Application Priority Data

Feb. 13, 2019 (JP) ................................. 2019-023439

(51) Int. Cl.
*G01R 33/00* (2006.01)
*G01R 33/09* (2006.01)
*G01R 33/022* (2006.01)

(52) U.S. Cl.
CPC ......... *G01R 33/091* (2013.01); *G01R 33/022* (2013.01)

(58) Field of Classification Search
CPC .. G01R 33/022; G01R 33/091; G01R 15/205; G01R 33/0017; G01R 33/02
See application file for complete search history.

(56) References Cited

U.S. PATENT DOCUMENTS 9,116,195 B2  8/2015 Yamashita et al.
11,243,274 B2*  2/2022 Saruki .................... G01R 33/09
(Continued)

FOREIGN PATENT DOCUMENTS

CN  104834021 A  8/2015
JP  2008-513762 A  5/2008

OTHER PUBLICATIONS

Feb. 9, 2021 Office Action issued in Japanese Patent Application No. 2019-023439.
(Continued)

*Primary Examiner* — Alesa Allgood
(74) *Attorney, Agent, or Firm* — Oliff PLC

(57) ABSTRACT

A magnetic sensor system includes two magnetic sensors that detect components in two directions of an external magnetic field, an additional magnetic field generation section, and a signal processing circuit. The additional magnetic field generation section is capable of generating two additional magnetic fields for use in measuring the sensitivities of the two magnetic sensors. The signal processing circuit includes a sensitivity measurement processing section and a detection signal correction processing section. The sensitivity measurement processing section measures the sensitivities based on data concerning changes in the detection signals of the two magnetic sensors when the additional magnetic field generation section is controlled to generate two additional magnetic fields. The detection signal correction processing section performs processing for reducing change components attributable to the two additional magnetic fields on the detection signals of the two magnetic sensors.

13 Claims, 13 Drawing Sheets

(56) References Cited

U.S. PATENT DOCUMENTS

2007/0247141 A1 10/2007 Pastre et al.
2012/0153936 A1* 6/2012 Romani ............. G01R 33/0023
   324/202

OTHER PUBLICATIONS

May 17, 2021 U.S. Office Action issued iin U.S. Appl. No. 16/744,359.
Oct. 1, 2021 Notice of Allowance Issued In U.S. Appl. No. 16/744,359.
Apr. 29, 2022 Office Action issued in Chinese Patent Application No. 202010090667.0.

* cited by examiner

MAGNETIC SENSOR SYSTEM

This application is a Continuation of U.S. patent application Ser. No. 16/744,359 filed Jul. 16, 2020, which claims the benefit of Japanese Patent Application No. 2019-023439 filed Feb. 13, 2019. The disclosure of the prior applications is hereby incorporated by reference herein in its entirety.

BACKGROUND OF THE INVENTION

1. Field of the Invention

The present invention relates to a magnetic sensor system including a magnetic sensor and a signal processing circuit for processing a detection signal of the magnetic sensor.

2. Description of the Related Art

Magnetic sensors for detecting a component in one direction of an external magnetic field have recently been used in a variety of applications. A type of magnetic sensor is known that incorporates at least one magnetic detection element provided on a substrate. An example of the magnetic detection element is a magnetoresistive element.

The magnetic sensor for detecting a component in one direction of an external magnetic field generates a detection signal corresponding to the component in the one direction of the external magnetic field. The foregoing one direction will be referred to as a sensing direction. The magnetic sensor preferably has such a characteristic that the detection signal changes in response to a change in the strength of a magnetic field in a desired direction and does not change in response to a change in the strength of the magnetic field in a direction other than the desired direction. The foregoing desired direction will be referred to as a main-axis direction. The sensing direction preferably coincides with the main-axis direction.

In the foregoing magnetic sensor, the ratio of a change in the detection signal to a change in the strength of a magnetic field in the main-axis direction will be referred to as a main-axis sensitivity. The main-axis sensitivity can vary due to individual differences of magnetic sensors. In a device including a plurality of magnetic sensors for detecting components of an external magnetic field in a plurality of directions, the respective main-axis sensitivities of the magnetic sensors may be different from each other. The main-axis sensitivity can also vary depending on the environment of use of the magnetic sensor. A device including a magnetic sensor is therefore desirably capable of measuring the main-axis sensitivity of the magnetic sensor and correcting the detection signal of the magnetic sensor on the basis of the measurement results according to need.

U.S. Pat. No. 9,116,195 B2 discloses a magnetic sensor including a semiconductor substrate provided with a plurality of magnetosensitive elements spaced from each other, and a magnetic substance provided on the semiconductor substrate. The plurality of magnetosensitive elements are placed at edge areas of the magnetic substance. The magnetic sensor detects magnetic-field strengths for two or three mutually orthogonal axes on the basis of outputs of the plurality of magnetosensitive elements. In this magnetic sensor, the sensing direction of each magnetosensitive element is a vertical direction. This magnetic sensor includes a horizontal magnetic field generating coil for sensitivity measurement, and a plurality of vertical magnetic field generating coils for sensitivity measurement. The horizontal magnetic field generating coil generates a horizontal magnetic field component. The horizontal magnetic field component causes vertical magnetic field components to occur near the edge of the magnetic substance, and the plurality of magnetosensitive elements detect those vertical magnetic field components to thereby detect the horizontal magnetic field component. The plurality of vertical magnetic field generating coils are provided near the plurality of magnetosensitive elements and generate vertical magnetic field components. The plurality of magnetosensitive elements respectively detect the vertical magnetic field components generated by the plurality of vertical magnetic field generating coils. This magnetic sensor is able to measure the main-axis sensitivity for the two or three axes.

Disadvantageously, the magnetic sensor disclosed in U.S. Pat. No. 9,116,195 B2 necessitates interruption of a normal operation of the magnetic sensor when measuring the main-axis sensitivity.

SUMMARY OF THE INVENTION

It is an object of the present invention to provide a magnetic sensor system that makes it possible to measure the sensitivity of a magnetic sensor without necessitating interruption of a normal operation of the magnetic sensor.

A magnetic sensor system of the present invention includes: at least one magnetic sensor that generates a detection signal having a correspondence with a component in a predetermined direction of an external magnetic field; an additional magnetic field generation section capable of generating at least one additional magnetic field for use in measuring the sensitivity of the at least one magnetic sensor; and a signal processing circuit that controls the additional magnetic field generation section and processes the detection signal of the at least one magnetic sensor.

The signal processing circuit performs sensitivity measurement processing and detection signal correction processing. The sensitivity measurement processing includes obtaining at least one data concerning a change in the detection signal of the at least one magnetic sensor when the additional magnetic field generation section is controlled to generate the at least one additional magnetic field, and measuring the sensitivity of the at least one magnetic sensor on the basis of the at least one data obtained. The detection signal correction processing includes performing, on the detection signal of the at least one magnetic sensor, processing for reducing a change component attributable to the at least one additional magnetic field.

In the magnetic sensor system of the present invention, the detection signal correction processing may include performing processing for subtracting an estimated value of the change component attributable to the at least one additional magnetic field from the detection signal of the at least one magnetic sensor.

In the magnetic sensor system of the present invention, the at least one additional magnetic field may be at least one alternating-current magnetic field. In such a case, the detection signal of the at least one magnetic sensor contains an alternating-current change component attributable to the at least one additional magnetic field. The detection signal correction processing may include performing filtering processing for reducing the change component on the detection signal of the at least one magnetic sensor.

In the magnetic sensor system of the present invention, the at least one magnetic sensor may be a first magnetic sensor that generates a first detection signal and a second magnetic sensor that generates a second detection signal. The first detection signal may have a correspondence with a first external magnetic field component, the first external magnetic field component being a component in a first sensing direction of the external magnetic field. The second detection signal may have a correspondence with a second external magnetic field component, the second external magnetic field component being a component in a second sensing direction of the external magnetic field. In such a case, the additional magnetic field generation section may be capable of generating, as the at least one additional magnetic field, a first additional magnetic field for use in measuring the sensitivity of the first magnetic sensor, and a second additional magnetic field for use in measuring the sensitivity of the second magnetic sensor. When the first additional magnetic field is generated by the additional magnetic field generation section, a first additional magnetic field component is applied to the first magnetic sensor, the first additional magnetic field component being a component of the first additional magnetic field and being in a direction parallel to a first direction. When the second additional magnetic field is generated by the additional magnetic field generation section, a second additional magnetic field component is applied to the second magnetic sensor, the second additional magnetic field component being a component of the second additional magnetic field and being in a direction parallel to a second direction.

The sensitivity measurement processing may include obtaining first data concerning a change in the first detection signal when the additional magnetic field generation section is controlled to generate the first additional magnetic field, and second data concerning a change in the second detection signal when the additional magnetic field generation section is controlled to generate the second additional magnetic field. The sensitivity measurement processing may include measuring the sensitivity of the first magnetic sensor to the first additional magnetic field component on the basis of the first data and measuring the sensitivity of the second magnetic sensor to the second additional magnetic field component on the basis of the second data.

The detection signal correction processing may include performing processing for reducing a change component attributable to the first additional magnetic field on the first detection signal, and performing processing for reducing a change component attributable to the second additional magnetic field on the second detection signal.

When the first additional magnetic field is generated by the additional magnetic field generation section, the first additional magnetic field component may further be applied to the second magnetic sensor. When the second additional magnetic field is generated by the additional magnetic field generation section, the second additional magnetic field component may further be applied to the first magnetic sensor.

In such a case, the sensitivity measurement processing may further include obtaining third data concerning a change in the second detection signal when the additional magnetic field generation section is controlled to generate the first additional magnetic field, and fourth data concerning a change in the first detection signal when the additional magnetic field generation section is controlled to generate the second additional magnetic field. The sensitivity measurement processing may include measuring the sensitivity of the second magnetic sensor to the first additional magnetic field component on the basis of the third data, and measuring the sensitivity of the first magnetic sensor to the second additional magnetic field component on the basis of the fourth data.

The detection signal correction processing may include performing processing for subtracting an estimated value of the change component attributable to the first additional magnetic field from the first detection signal, and processing for subtracting an estimated value of the change component attributable to the second additional magnetic field from the second detection signal.

Each of the first and second additional magnetic fields may be an alternating-current magnetic field. In such a case, the first detection signal contains a first alternating-current change component attributable to the first additional magnetic field, and the second detection signal contains a second alternating-current change component attributable to the second additional magnetic field. The detection signal correction processing may include performing filtering processing for reducing the first alternating-current change component on the first detection signal and performing filtering processing for reducing the second alternating-current change component on the second detection signal.

According to the magnetic sensor system of the present invention, the detection signal of the magnetic sensor is subjected to processing for reducing a change component attributable to the additional magnetic field. This makes it possible to measure the sensitivity of the magnetic sensor without necessitating interruption of a normal operation of the magnetic sensor.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. First, a magnetic sensor system according to a first embodiment of the invention will be outlined with reference to FIG. 1 and FIG. 2. The magnetic sensor system 1 according to the present embodiment is configured to generate an angle detection value θs having a correspondence with an angle to be detected. Hereinafter, the angle to be detected will be referred to as an angle of interest.

Figure 1:
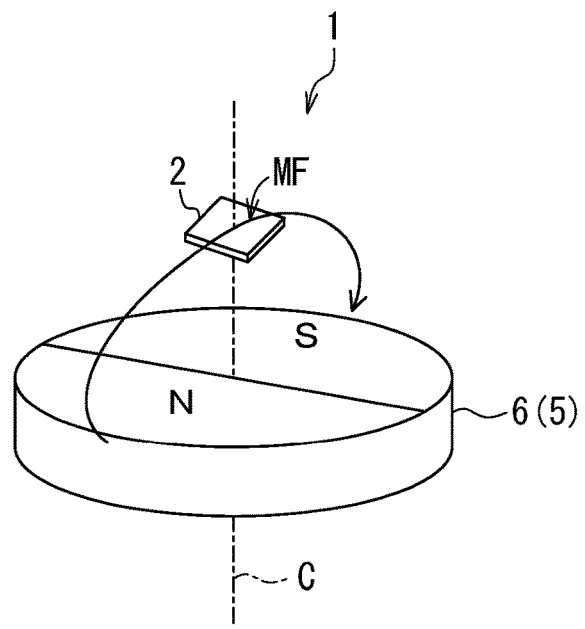
FIG. 1 is a perspective view illustrating a target magnetic field generation section and a magnetic sensor device of a first embodiment of the invention.
Figure 2:
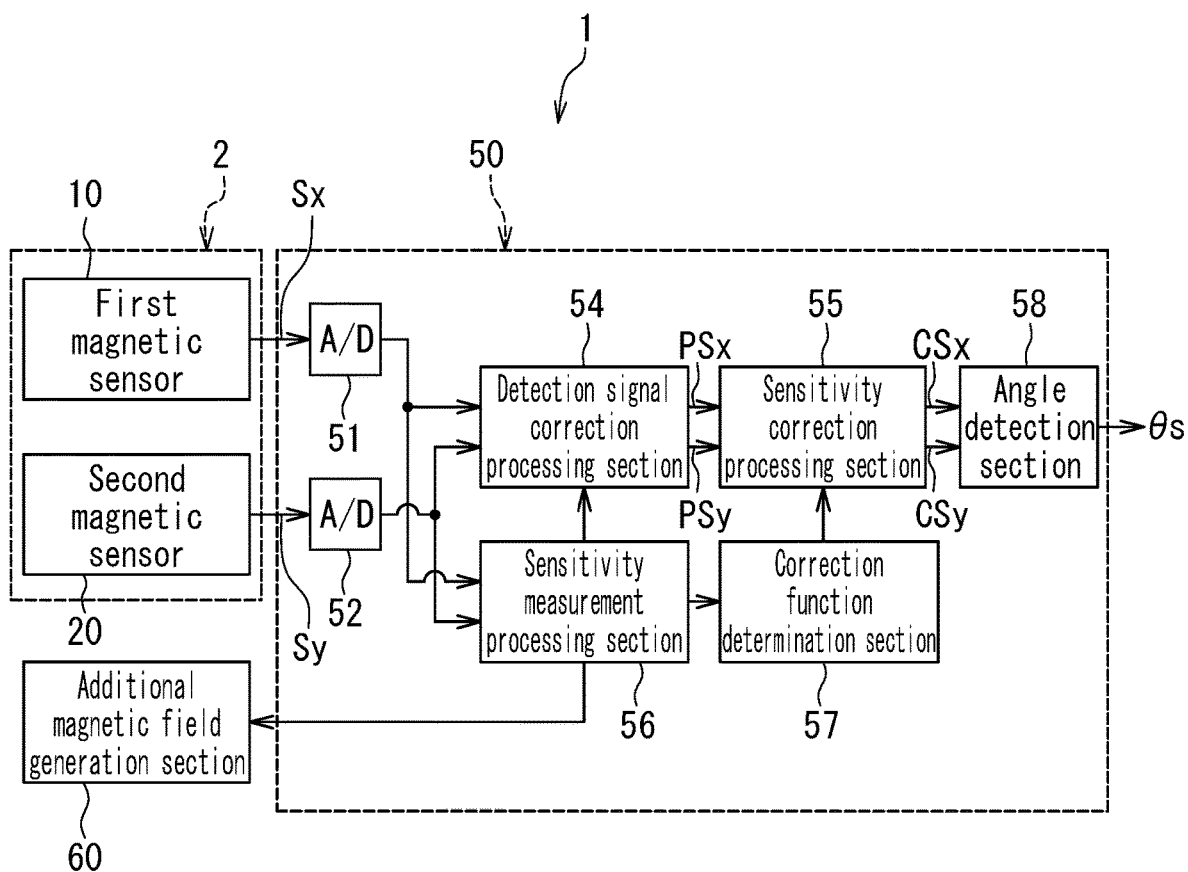
FIG. 2 is a block diagram illustrating a configuration of a magnetic sensor system according to the first embodiment of the invention.

As shown in FIG. 2, the magnetic sensor system 1 includes a magnetic sensor device 2, an additional magnetic field generation section 60, and a signal processing circuit 50. As shown in FIG. 1, the magnetic sensor system 1 further includes a target magnetic field generation section 5.

The target magnetic field generation section 5 generates a target magnetic field MF, which is a magnetic field to be detected by the magnetic sensor device 2. In the present embodiment, the target magnetic field MF is a magnetic field whose direction rotates with variations in the angle of interest. In the present embodiment, the target magnetic field generation section 5 is a magnet 6 of a cylindrical shape having a central axis. The magnet 6 has an N pole and an S pole that are arranged symmetrically with respect to an imaginary plane including the aforementioned central axis. The magnet 6 rotates around the central axis. This causes the magnet 6 to generate the target magnetic field MF. The direction of the target magnetic field MF rotates around a center of rotation C including the central axis. In the present embodiment, the angle of interest is an angle corresponding to the rotational position of the magnet 6.

The magnetic sensor device 2 and the signal processing circuit 50 generate a value indicating a target magnetic field angle θM, as the angle detection value θs. The target magnetic field angle θM is an angle that a direction DM of the target magnetic field MF at a reference position PR in a reference plane P forms with respect to a reference direction DR. The target magnetic field angle θM has a correspondence with the angle of interest. The angle detection value θs thus has a correspondence with the angle of interest.

The magnetic sensor device 2 generates a first detection signal Sx and a second detection signal Sy that have correspondences with two components of the target magnetic field MF at the reference position PR, the two components being in mutually different directions. The target magnetic field MF at the reference position PR corresponds to an external magnetic field in the present invention. Hereinafter, the target magnetic field MF at the reference position PR will also be referred to as an external magnetic field.

As shown in FIG. 2, the magnetic sensor device 2 includes a first magnetic sensor 10 and a second magnetic sensor 20. The first magnetic sensor 10 detects a component in a first sensing direction of the external magnetic field and generates the first detection signal Sx. The first sensing direction corresponds to one of the aforementioned two directions. The component in the first sensing direction of the external magnetic field will hereinafter be referred to as a first external magnetic field component. In the present embodiment, the first detection signal Sx is specifically a signal corresponding to the strength Bx of the first external magnetic field component.

The second magnetic sensor 20 detects a component in a second sensing direction of the external magnetic field and generates the second detection signal Sy. The second sensing direction corresponds to the other of the aforementioned two directions. The component in the second sensing direction of the external magnetic field will hereinafter be referred to as a second external magnetic field component. In the present embodiment, the second detection signal Sy is specifically a signal corresponding to the strength By of the second external magnetic field component.

Figure 3:
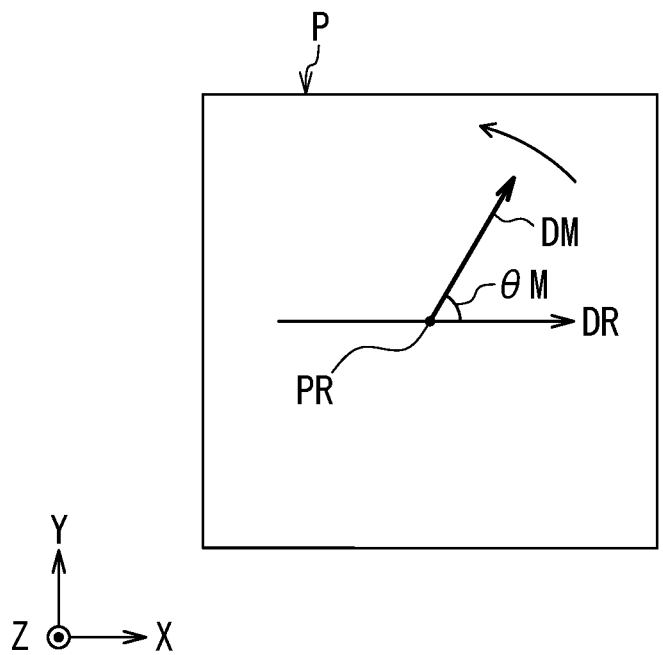
FIG. 3 is an explanatory diagram illustrating a reference plane for the first embodiment of the invention.

Now, a description will be given of a reference coordinate system and first and second sensor coordinate systems of the present embodiment with reference to FIG. 1 and FIG. 3. The reference coordinate system is a coordinate system that is set with reference to the reference plane P. The first sensor coordinate system is a coordinate system that is set with reference to the first magnetic sensor 10. The second sensor coordinate system is a coordinate system that is set with reference to the second magnetic sensor 20. The first and second sensor coordinate systems will hereinafter be simply referred to as a sensor coordinate system, as a generic term. Three mutually orthogonal directions, i.e., an X direction, a Y direction, and a Z direction are defined in both of the reference coordinate system and the sensor coordinate system. For both of the reference coordinate system and the sensor coordinate system, the opposite direction to the X direction is defined as the −X direction, and the opposite direction to the Y direction as the −Y direction.

The reference plane P is an imaginary plane parallel to one of opposite end faces of the magnet 6. The reference position PR is a position at which the magnetic sensor device 2 detects the target magnetic field MF. The reference direction DR is in the reference plane P and intersects the reference position PR. The direction DM of the target magnetic field MF at the reference position PR is also in the reference plane P. The magnetic sensor device 2 is disposed to face the aforementioned one of opposite end faces of the magnet 6.

The Z direction of the reference coordinate system is a direction parallel to the center of rotation C shown in FIG. 1 and directed from bottom to top in FIG. 1. The Z direction of the reference coordinate system is perpendicular to the reference plane P. The X and Y directions of the reference coordinate system are two directions perpendicular to the Z direction of the reference coordinate system and orthogonal to each other.

In the present embodiment, the reference direction DR is the X direction of the reference coordinate system. In the reference plane P, the direction DM of the target magnetic field MF rotates around the reference position PR. The target magnetic field angle θM is expressed as a positive value when viewed counterclockwise from the reference direction DR in FIG. 3, and as a negative value when viewed clockwise from the reference direction DR in FIG. 3.

The magnetic sensor device 2 is designed so that the first and second sensor coordinate systems coincide with the reference coordinate system. However, at least one of the first sensor coordinate system or the second sensor coordinate system can deviate from the reference coordinate system due to reasons such as misalignment between the first and second magnetic sensors 10 and 20.

In the present embodiment, the first sensing direction is a direction parallel to the X direction of the first sensor coordinate system, and the second sensing direction is a direction parallel to the Y direction of the second sensor coordinate system. Hereinafter, a direction parallel to the X direction of the reference coordinate system will be referred to as a first main-axis direction, and a direction parallel to the Y direction of the reference coordinate system will be referred to as a second main-axis direction. Ideally, the first sensing direction should coincide with the first main-axis direction, and the second sensing direction should coincide with the second main-axis direction. However, the first sensing direction may deviate from the first main-axis direction and/or the second sensing direction may deviate from the second main-axis direction due to, for example, misalignment of at least one of the first magnetic sensor 10 or the second magnetic sensor 20 with the magnet 6.

Hereinafter, unless otherwise specified, the X, Y, and Z directions shown in the drawings shall apply to both of the reference coordinate system and the sensor coordinate system.

Figure 4:
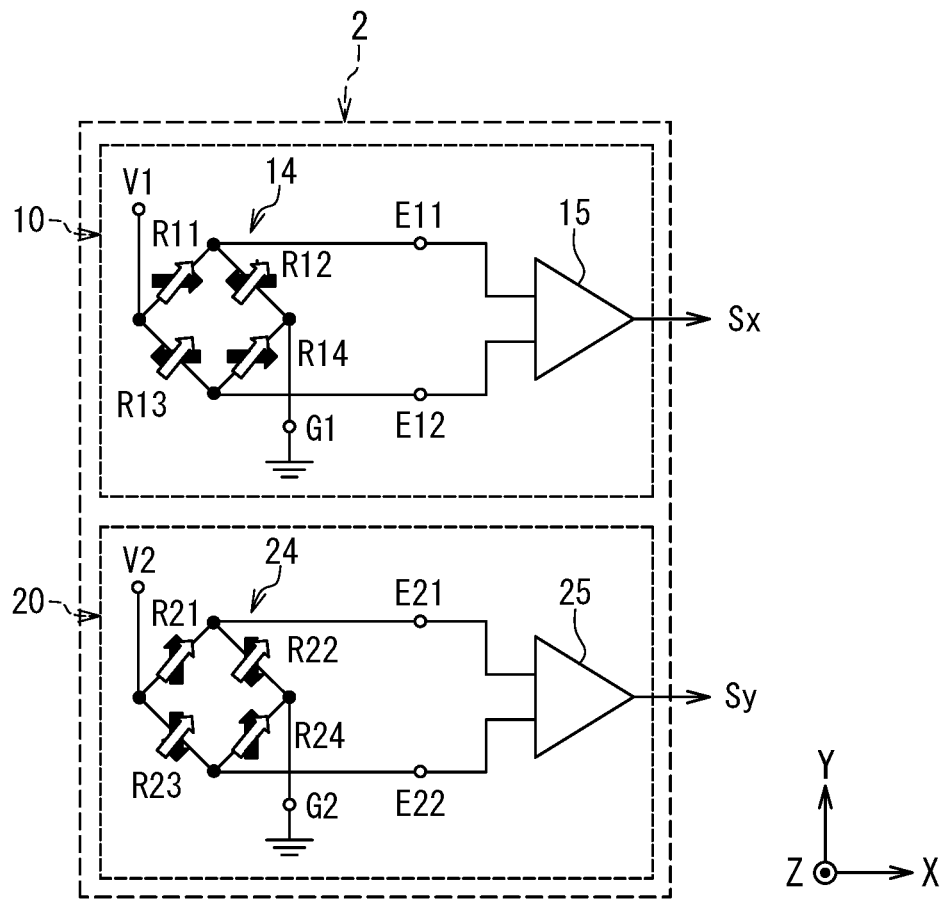
FIG. 4 is a circuit diagram illustrating a configuration of the magnetic sensor device of the first embodiment of the invention.

Next, a configuration of the magnetic sensor device 2 will be described with reference to FIG. 4. As shown in FIG. 4, the first magnetic sensor 10 includes a Wheatstone bridge circuit 14 and a difference detector 15. The Wheatstone bridge circuit 14 includes four magnetic detection elements R11, R12, R13 and R14, a power supply port V1, a ground port G1, and two output ports E11 and E12. The magnetic detection element R11 is provided between the power supply port V1 and the output port E11. The magnetic detection element R12 is provided between the output port E11 and the ground port G1. The magnetic detection element R13 is provided between the power supply port V1 and the output port E12. The magnetic detection element R14 is provided between the output port E12 and the ground port G1. A power supply voltage of predetermined magnitude is applied to the power supply port V1. The ground port G1 is connected to ground. The difference detector 15 outputs a signal corresponding to a potential difference between the output ports E11 and E12 as the first detection signal Sx. The first detection signal Sx may be one obtained by adjusting the amplitude or offset of the potential difference between the output ports E11 and E12.

The second magnetic sensor 20 includes a Wheatstone bridge circuit 24 and a difference detector 25. The Wheatstone bridge circuit 24 includes four magnetic detection elements R21, R22, R23 and R24, a power supply port V2, a ground port G2, and two output ports E21 and E22. The magnetic detection element R21 is provided between the power supply port V2 and the output port E21. The magnetic detection element R22 is provided between the output port E21 and the ground port G2. The magnetic detection element R23 is provided between the power supply port V2 and the output port E22. The magnetic detection element R24 is provided between the output port E22 and the ground port G2. A power supply voltage of predetermined magnitude is applied to the power supply port V2. The ground port G2 is connected to ground. The difference detector 25 outputs a signal corresponding to a potential difference between the output ports E21 and E22 as the second detection signal Sy. The second detection signal Sy may be one obtained by adjusting the amplitude or offset of the potential difference between the output ports E21 and E22.

Hereinafter, the magnetic detection elements R11 to R14 and R21 to R24 will be simply referred to as a magnetic detection element R, as a generic term. The magnetic detection element R may include a plurality of magnetoresistive (MR) elements connected in series. Each of the plurality of MR elements is a spin-valve MR element, for example. The spin-valve MR element includes a magnetization pinned layer whose magnetization direction is pinned, a free layer which is a magnetic layer whose magnetization direction varies depending on an external magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element varies depending on the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In FIG. 4, the filled arrows indicate the magnetization directions of the magnetization pinned layers of the MR elements, and the hollow arrows indicate the magnetization directions of the free layers of the MR elements. In each MR element, the free layer has a uniaxial magnetic anisotropy that sets the direction of the magnetization easy axis to be orthogonal to the magnetization direction of the magnetization pinned layer. The uniaxial magnetic anisotropy may be shape magnetic anisotropy.

In the first magnetic sensor 10, the magnetization pinned layers of the MR elements included in the magnetic detection elements R11 and R14 are magnetized in the X direction of the first sensor coordinate system, and the magnetization pinned layers of the MR elements included in the magnetic detection elements R12 and R13 are magnetized in the −X direction of the first sensor coordinate system. In the MR elements in the first magnetic sensor 10, the angle that the magnetization direction of the free layer forms with respect to the magnetization direction of the magnetization pinned layer varies depending on the strength Bx of the first external magnetic field component. As a result, the first detection signal Sx varies depending on the strength Bx.

In the second magnetic sensor 20, the magnetization pinned layers of the MR elements included in the magnetic detection elements R21 and R24 are magnetized in the Y direction of the second sensor coordinate system, and the magnetization pinned layers of the MR elements included in the magnetic detection elements R22 and R23 are magnetized in the −Y direction of the second sensor coordinate system. In the MR elements in the second magnetic sensor 20, the angle that the magnetization direction of the free layer forms with respect to the magnetization direction of the magnetization pinned layer varies depending on the strength By of the second external magnetic field component. As a result, the second detection signal Sy varies depending on the strength By.

In the light of the production accuracy of the MR elements or other factors, the magnetization directions of the magnetization pinned layers of the MR elements in the magnetic sensors 10 and 20 can deviate from the desired directions described above.

An example configuration of the MR elements will now be described with reference to FIG. 5. The MR elements are formed on a substrate (not shown). The MR element 100 shown in FIG. 5 includes an antiferromagnetic layer 101, a magnetization pinned layer 102, a gap layer 103, and a free layer 104 which are stacked in this order, from closest to farthest from the substrate. The antiferromagnetic layer 101 is formed of an antiferromagnetic material, and is in exchange coupling with the magnetization pinned layer 102 to thereby pin the magnetization direction of the magnetization pinned layer 102.

Figure 5:
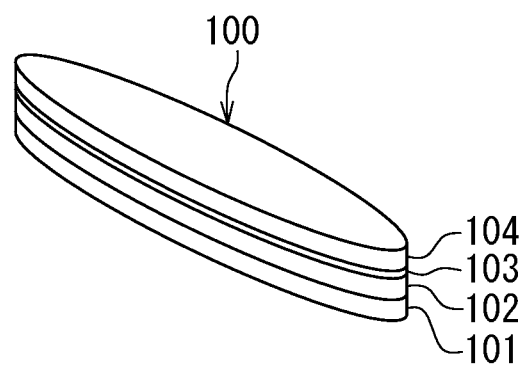
FIG. 5 is a perspective view illustrating a magnetoresistive element of the first embodiment of the invention.

The layers 101 to 104 of the MR element 100 may be stacked in the reverse order to that shown in FIG. 5. The magnetization pinned layer 102 need not necessarily be a single ferromagnetic layer but may have an artificial antiferromagnetic structure including two ferromagnetic layers and a nonmagnetic metal layer interposed between the two ferromagnetic layers. The MR element 100 may be configured without the antiferromagnetic layer 101. The magnetic detection element may be an element for detecting a magnetic field other than the MR element, such as a Hall element or a magnetic impedance element.

Figure 6:
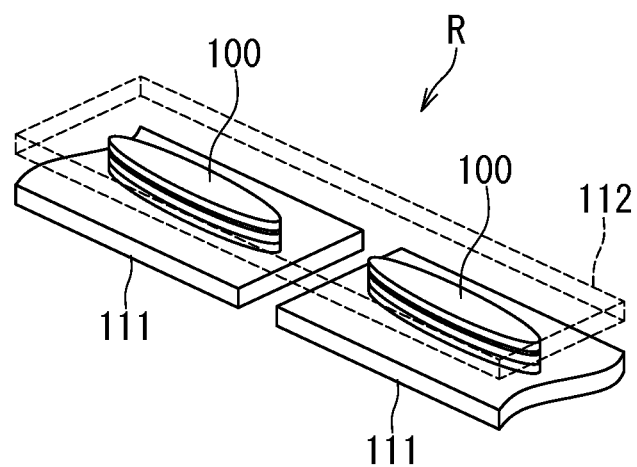
FIG. 6 is a perspective view of part of a resistor section of the first embodiment of the invention.

Next, an example configuration of the magnetic detection element R will be described with reference to FIG. 6. In this example, the magnetic detection element R includes a plurality of MR elements 100 connected in series. The magnetic detection element R further includes one or more connection layers for electrically connecting two MR elements 100 that are adjacent to each other in circuit configuration, so that the plurality of MR elements 100 are connected in series. In the example shown in FIG. 6 the magnetic detection element R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, a description will be given of the additional magnetic field generation section 60. The additional magnetic field generation section 60 is capable of generating at least one additional magnetic field for use in measuring the sensitivity of at least one magnetic sensor. In the present embodiment, specifically, the additional magnetic field generation section 60 is capable of generating a first additional magnetic field for use in measuring the sensitivity of the first magnetic sensor 10 and a second additional magnetic field for use in measuring the sensitivity of the second magnetic sensor 20, as the at least one additional magnetic field. The magnetic sensor device 2 and the additional magnetic field generation section 60 may be integrated with each other.

Figure 7:
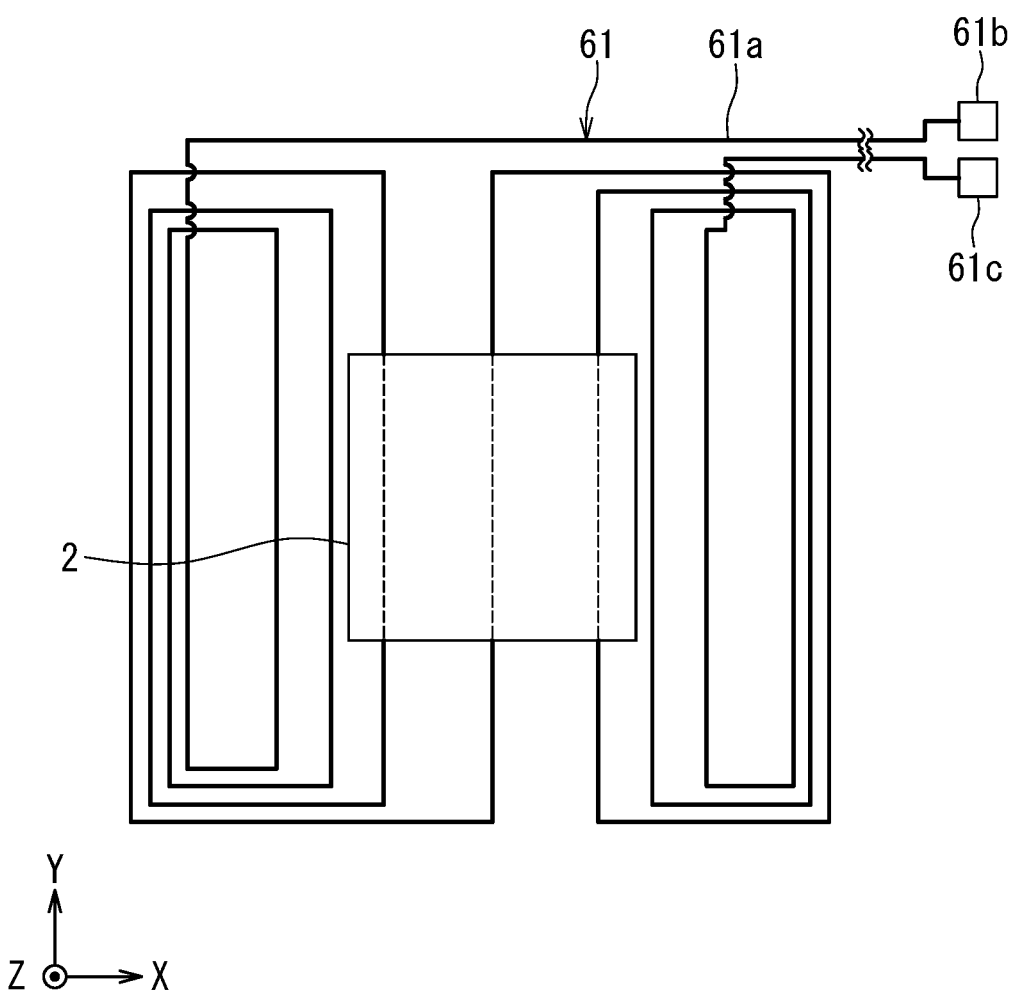
FIG. 7 is an explanatory diagram schematically illustrating a first additional magnetic field generator of the first embodiment of the invention.
Figure 8:
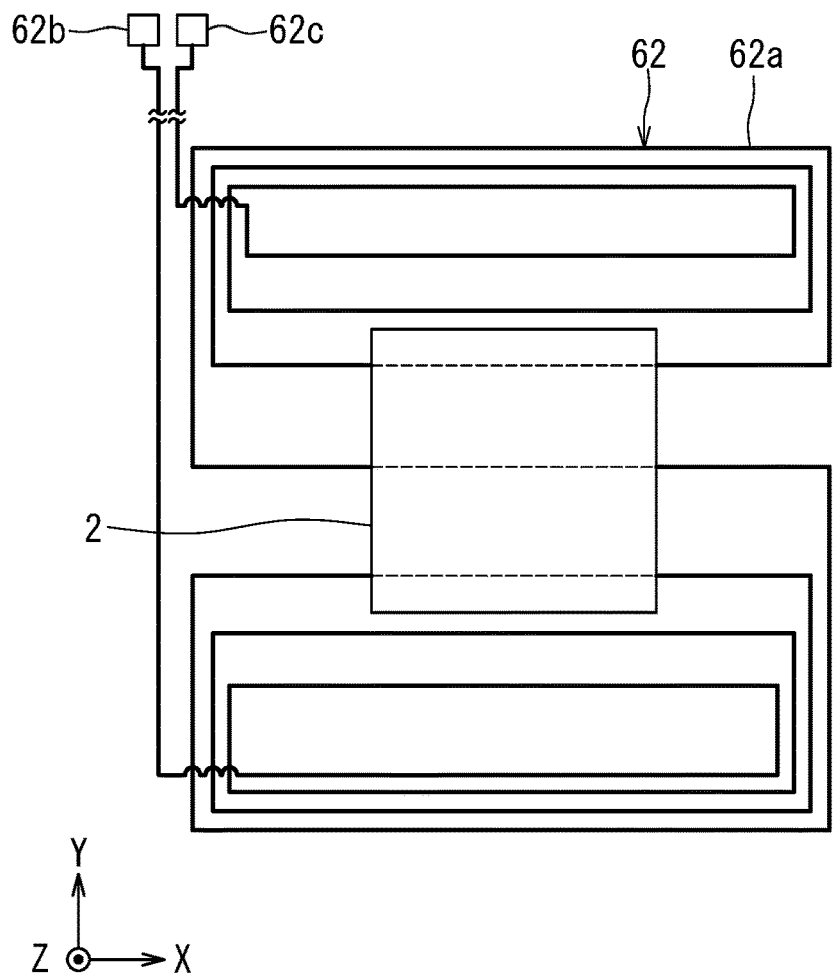
FIG. 8 is an explanatory diagram schematically illustrating a second additional magnetic field generator of the first embodiment of the invention.

FIG. 7 and FIG. 8 illustrate an example configuration of the additional magnetic field generation section 60. In this example, the additional magnetic field generation section 60 includes a first additional magnetic field generator 61 capable of generating the first additional magnetic field, and a second additional magnetic field generator 62 capable of generating the second additional magnetic field. In the following description, the term "above" refers to positions located forward relative to a reference position in the Z direction. In the example shown in FIG. 7 and FIG. 8, the magnetic sensor device 2 is disposed above the first and second additional magnetic field generators 61 and 62.

FIG. 7 is an explanatory diagram schematically illustrating the first additional magnetic field generator 61. When the first additional magnetic field is generated by the first additional magnetic field generator 61, a first additional magnetic field component is applied to each of the first and second magnetic sensors 10 and 20 included in the magnetic sensor device 2. The first additional magnetic field component is a component of the first additional magnetic field and is in a direction parallel to a first direction. In the present embodiment, specifically, the first direction coincides with the X direction of the reference coordinate system. The foregoing first main-axis direction is a direction parallel to the first direction.

As shown in FIG. 7, the first additional magnetic field generator 61 includes a coil conductor 61a, and two terminals 61b and 61c connected to opposite ends of the coil conductor 61a. The coil conductor 61a includes a plurality of first conductor portions located near the magnetic sensor device 2 and extending in the Y direction of the reference coordinate system. The coil conductor 61a is wound along the XY plane of the reference coordinate system so that when a current is passed from the terminal 61b to the terminal 61c, the direction of the current flowing through each of the plurality of first conductor portions becomes the Y direction of the reference coordinate system.

If a current is passed in the direction from the terminal 61b to the terminal 61c, the direction of the current flowing through each of the plurality of first conductor portions becomes the Y direction of the reference coordinate system, and the direction of the first additional magnetic field component becomes the X direction of the reference coordinate system. If the direction of the current in the above example is reversed, the direction of the first additional magnetic field component becomes the −X direction of the reference coordinate system.

FIG. 8 is an explanatory diagram schematically illustrating the second additional magnetic field generator 62. When the second additional magnetic field is generated by the second additional magnetic field generator 62, a second additional magnetic field component is applied to each of the first and second magnetic sensors 10 and 20 included in the magnetic sensor device 2. The second additional magnetic field component is a component of the second additional magnetic field and is in a direction parallel to a second direction. In the present embodiment, specifically, the second direction coincides with the Y direction of the reference coordinate system. The foregoing second main-axis direction is a direction parallel to the second direction.

As shown in FIG. 8, the second additional magnetic field generator 62 includes a coil conductor 62a, and two terminals 62b and 62c connected to opposite ends of the coil conductor 62a. The coil conductor 62a includes a plurality of second conductor portions located near the magnetic sensor device 2 and extending in the X direction of the reference coordinate system. The coil conductor 62a is wound along the XY plane of the reference coordinate system so that when a current is passed from the terminal 62b to the terminal 62c, the direction of the current flowing through each of the plurality of second conductor portions becomes the −X direction of the reference coordinate system.

If a current is passed in the direction from the terminal 62b to the terminal 62c, the direction of the current flowing through each of the plurality of second conductor portions becomes the −X direction of the reference coordinate system, and the direction of the second additional magnetic field component becomes the Y direction of the reference coordinate system. If the direction of the current in the above example is reversed, the direction of the second additional magnetic field component becomes the −Y direction of the reference coordinate system.

Next, a configuration of the signal processing circuit 50 will be described in detail with reference to FIG. 2. The signal processing circuit 50 controls the additional magnetic field generation section 60 and processes the first and second detection signals Sx and Sy. The signal processing circuit 50 is constructed of an application-specific integrated circuit (ASIC) or a microcomputer, for example. The signal processing circuit 50 includes analog-to-digital converters (hereinafter referred to as A/D converters) 51 and 52, a detection signal correction processing section 54, a sensitivity correction processing section 55, a sensitivity measurement processing section 56, a correction function determination section 57, and an angle detection section 58.

The A/D converter 51 converts the first detection signal Sx into digital form. The A/D converter 52 converts the second detection signal Sy into digital form. The detection signal correction processing section 54, the sensitivity correction processing section 55, the sensitivity measurement processing section 56, the correction function determination section 57, and the angle detection section 58 are functional blocks for performing processing described below.

The detection signal correction processing section 54 performs detection signal correction processing. The sensitivity correction processing section 55 performs sensitivity correction processing. The sensitivity measurement processing section 56 performs sensitivity measurement processing. The correction function determination section 57 performs correction function determination processing. The angle detection section 58 performs processing for generating the angle detection value θs.

The terminals 61b and 61c of the first additional magnetic field generator 61 shown in FIG. 7 and the terminals 62b and 62c of the second additional magnetic field generator 62 shown in FIG. 8 are connected to the signal processing circuit 50. The sensitivity measurement processing section 56 controls the first and second additional magnetic field generators 61 and 62 through the these terminals.

The sensitivity measurement processing by the sensitivity measurement processing section 56 includes obtaining at least one data concerning a change in the detection signal of at least one magnetic sensor when the additional magnetic field generation section 60 is controlled to generate at least one additional magnetic field, and measuring the sensitivity of the at least one magnetic sensor on the basis of the at least one data obtained. In the present embodiment, the sensitivity measurement processing specifically includes controlling the first and second additional magnetic field generators 61 and 62 to generate the first and second additional magnetic fields, and measuring the respective sensitivities of the first and second magnetic sensors 10 and 20 on the basis of data concerning respective changes in the first and second detection signals Sx and Sy obtained when the first and second additional magnetic fields are generated. The sensitivity measurement processing section 56 outputs to the correction function determination section 57 the measurement results of the respective sensitivities of the first and second magnetic sensors 10 and 20 obtained by the sensitivity measurement processing.

The detection signal correction processing by the detection signal correction processing section 54 includes performing, on the detection signal of the at least one magnetic sensor, processing for reducing a change component attributable to the at least one additional magnetic field. In the present embodiment, the detection signal correction processing specifically includes performing processing for reducing a change component attributable to the first additional magnetic field on the first detection signal Sx converted into digital form by the A/D converter 51, and performing processing for reducing a change component attributable to the second additional magnetic field on the second detection signal Sy converted into digital form by the A/D converter 52.

Hereinafter, the first and second detection signals having undergone the detection signal correction processing will be referred to as detection signals PSx and PSy, respectively. The detection signal correction processing section 54 outputs the detection signals PSx and PSy to the sensitivity correction processing section 55. When the sensitivity measurement processing is not performed, any change component attributable to the first or second additional magnetic field does not occur in the detection signal Sx or Sy. Therefore, when the sensitivity measurement processing is not performed, the detection signals PSx and PSy are the same as the detection signals Sx and Sy, respectively.

Figure 9:
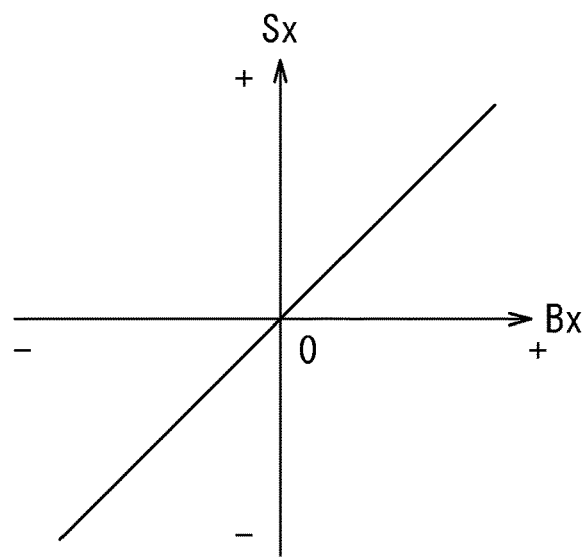
FIG. 9 is a characteristic chart illustrating an ideal characteristic of a first magnetic sensor of the first embodiment of the invention.

Now, ideal characteristics of the first and second magnetic sensors 10 and 20 of the present embodiment will be described with reference to FIG. 9 and FIG. 10. FIG. 9 is a characteristic chart showing the ideal characteristic of the first magnetic sensor 10. In FIG. 9, the horizontal axis represents the strength Bx of the first external magnetic field component, and the vertical axis represents the first detection signal Sx. In the example shown in FIG. 9, the strength Bx is expressed as a positive value if the first external magnetic field component is in the X direction of the first sensor coordinate system, and as a negative value if the first external magnetic field component is in the −X direction of the first sensor coordinate system. In the example shown in FIG. 9, the first detection signal Sx has a value of 0 if the strength Bx is 0, has a positive value if the strength Bx has a positive value, and has a negative value if the strength Bx has a negative value. The value of the first detection signal Sx increases as the strength Bx increases. Ideally, as shown in FIG. 9, the first detection signal Sx generated by the first magnetic sensor 10 is proportional to the strength Bx of the first external magnetic field component.

Figure 10:
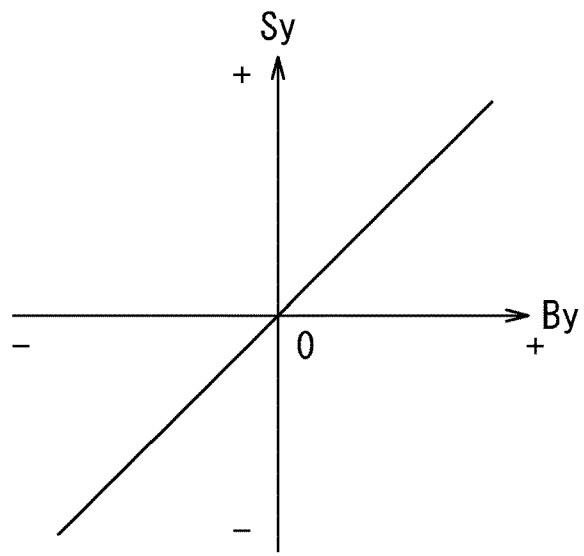
FIG. 10 is a characteristic chart illustrating an ideal characteristic of a second magnetic sensor of the first embodiment of the invention.

FIG. 10 is a characteristic chart showing the ideal characteristic of the second magnetic sensor 20. In FIG. 10, the horizontal axis represents the strength By of the second external magnetic field component, and the vertical axis represents the second detection signal Sy. In the example shown in FIG. 10, the strength By is expressed as a positive value if the second external magnetic field component is in the Y direction of the second sensor coordinate system, and as a negative value if the second external magnetic field component is in the −Y direction of the second sensor coordinate system. In the example shown in FIG. 10, the second detection signal Sy has a value of 0 if the strength By is 0, has a positive value if the strength By has a positive value, and has a negative value if the strength By has a negative value. The value of the second detection signal Sy increases as the strength By increases. Ideally, as shown in FIG. 10, the second detection signal Sy generated by the second magnetic sensor 20 is proportional to the strength By of the second external magnetic field component. Ideally, the ratio of a change in the second detection signal Sy to a change in the strength By is equal to the ratio of a change in the first detection signal Sx to a change in the strength Bx.

Ideally, the first and second sensor coordinate systems coincide with the reference coordinate system. Furthermore, ideally, the first detection signal Sx is independent of the strength By, and the second detection signal Sy is independent of the strength Bx.

The ideal state described above makes it possible to determine the angle detection value θs by the following Eq. (1).

$$\theta s = \operatorname{atan}(Sy/Sx) \quad (1)$$

Note that "a tan" represents an arctangent.

For θs ranging from 0° to less than 360°, Eq. (1) yields two solutions of θs that are 180° different in value. Which of the two solutions of θs in Eq. (1) is the true value of θs can be determined in accordance with the combination of the signs of Sx and Sy.

When not in the ideal state, however, an error occurs in at least one of the first detection signal Sx or the second detection signal Sy. In such a case, determining the angle detection value θs by Eq. (1) can cause an error in the angle detection value θs. The sensitivity correction processing is processing for correcting the detection signals PSx and PSy to generate first and second corrected signals CSx and CSy so that error occurring in the angle detection value θs is reduced.

The angle detection section 58 performs processing for generating the angle detection value θs on the basis of the first and second corrected signals CSx and CSy. Specifically, the angle detection section 58 generates the angle detection value θs by the following Eq. (2).

$$\theta s = \operatorname{atan}(CSy/CSx) \quad (2)$$

For θs ranging from 0° to less than 360°, Eq. (2) yields two solutions of θs that are 180° different in value. Which of the two solutions of θs in Eq. (2) is the true value of θs can be determined in accordance with the combination of the signs of CSx and CSy. The angle detection section 58 determines θs within the range of 0° to less than 360° in accordance with Eq. (2) and the determination on the combination of the signs of CSx and CSy.

In the present embodiment, the ideal state is defined by the following first to third conditions. The first condition is that the first sensing direction coincides with the first main-axis direction and the second sensing direction coincides with the second main-axis direction.

The second condition is that the ratio of a change in the first detection signal Sx to a change in the first external magnetic field component and the ratio of a change in the second detection signal Sy to a change in the second external magnetic field component are equal.

The third condition is that the ratio of a change in the second detection signal Sy to a change in the first external magnetic field component and the ratio of a change in the first detection signal Sx to a change in the second external magnetic field component are both zero.

The first detection signal Sx in the ideal state will be referred to as a first ideal signal. The second detection signal Sy in the ideal state will be referred to as a second ideal signal. The sensitivity correction processing by the sensitivity correction processing section 55 is processing for correcting the first and second detection signals PSx and PSy to generate the first and second corrected signals CSx and CSy so that the first and second corrected signals CSx and CSy are closer to the first and second ideal signals as compared to the detection signals PSx and PSy.

The correction function determination processing by the correction function determination section 57 includes determining correction functions for correcting the detection signals PSx and PSy in the sensitivity correction processing. The correction functions are determined on the basis of the measurement results of the respective sensitivities of the first and second magnetic sensors 10 and 20 obtained by the sensitivity measurement processing.

The sensitivity correction processing by the sensitivity correction processing section 55 will now be described concretely. The first and second corrected signals CSx and CSy are expressed in Eqs. (3) and (4) below, respectively.

$$CSx = C_{11}PSx + C_{12}PSy \quad (3)$$

$$CSy = C_{21}PSx + C_{22}PSy \quad (4)$$

In Eqs. (3) and (4), each of $C_{11}$, $C_{12}$, $C_{21}$, and $C_{22}$ represents a correction coefficient. Eqs. (3) and (4) represent correction functions.

A 2×2 matrix containing a correction coefficient $C_{ij}$ as an ith-row jth-column component will be referred to as a coefficient matrix MC, where i and j are integers that are each 1 or greater and not greater than 2. A column vector including the detection signals PSx and PSy as its elements will be referred to as a detection signal vector VPS. A column vector including the first and second corrected signals CSx and CSy as its elements will be referred to as a corrected signal vector VCS. The correction functions are expressed in Eq. (4) below using MC, VPS, and VCS.

$$VCS = MC \cdot VPS \quad (5)$$

In Eq. (5), VPS=$[PSx, PSy]^T$, and VCS=$[CSx, CSy]^T$.

The sensitivity correction processing section 55 performs the correction processing by using the detection signals PSx and PSy and the correction functions expressed in Eqs. (3) and (4) or Eq. (5).

Figure 11:
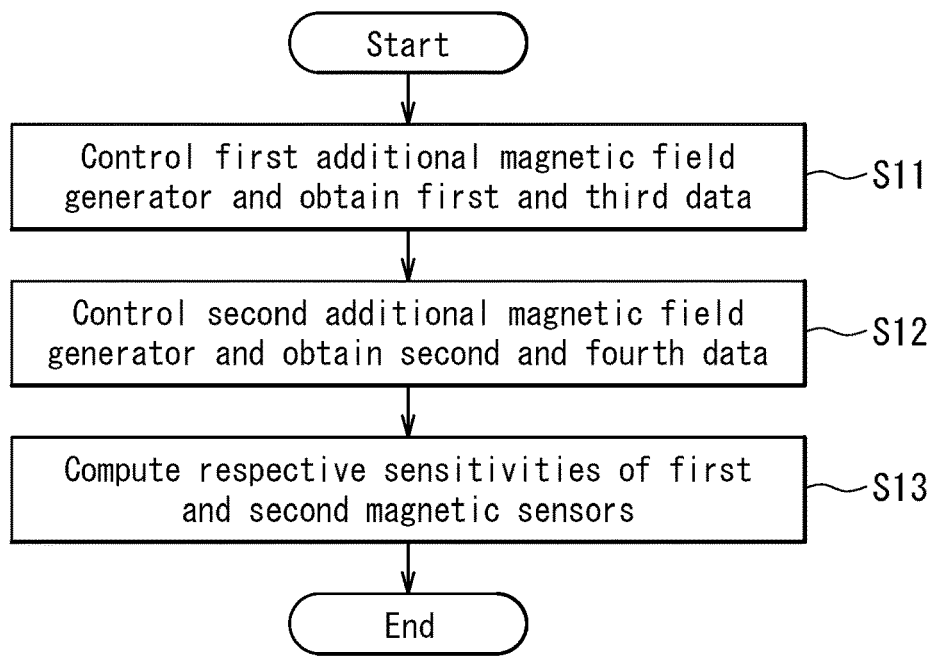
FIG. 11 is a flowchart of sensitivity measurement processing of the first embodiment of the invention.

Next, reference is made to FIG. 11 to describe the sensitivity measurement processing by the sensitivity measurement processing section 56 concretely. FIG. 11 is a flowchart of the sensitivity measurement processing. In the following description, the first additional magnetic field component applied to each of the first and second magnetic sensors 10 and 20 when the first additional magnetic field is generated will be denoted by the symbol Hx. The second additional magnetic field component applied to each of the first and second magnetic sensors 10 and 20 when the second additional magnetic field is generated will be denoted by the symbol Hy.

In the sensitivity measurement processing section, first, at step S11, the sensitivity measurement processing section 56 controls the first additional magnetic field generator 61 to generate the first additional magnetic field and to change the first additional magnetic field. The sensitivity measurement processing section 56 then obtains first and third data concerning respective changes in the first and second detection signals Sx and Sy when the first additional magnetic field is thus changed. For example, the first additional magnetic field may be changed so that the first additional magnetic field component Hx in the X direction and the first additional magnetic field component Hx in the −X direction are applied at different times to each of the first and second magnetic sensors 10 and 20.

Next, at step S12, the sensitivity measurement processing section 56 controls the second additional magnetic field generator 62 to generate the second additional magnetic field and to change the second additional magnetic field. The sensitivity measurement processing section 56 then obtains second and fourth data concerning respective changes in the second detection signal Sy and the first detection signal Sx when the second additional magnetic field is thus changed. For example, the second additional magnetic field may be changed so that the second additional magnetic field component Hy in the Y direction and the second additional magnetic field component Hy in the −Y direction are applied at different times to each of the first and second magnetic sensors 10 and 20.

Then, at step S13, the sensitivity measurement processing section 56 computes the respective sensitivities of the first and second magnetic sensors 10 and 20 on the basis of the first to fourth data obtained.

The amount of change in the first additional magnetic field component Hx applied to each of the first and second magnetic sensors 10 and 20 when the first additional magnetic field is changed at step S11 will be denoted by the symbol dHx. The amount of change in the second additional magnetic field component Hy applied to each of the first and second magnetic sensors 10 and 20 when the second additional magnetic field is changed at step S12 will be denoted by the symbol dHy.

For example, dHx and dHy can be determined before shipment or use of the magnetic sensor system 1 by measuring the first and second additional magnetic field components Hx and Hy when the first and second additional magnetic fields are changed. dHx and dHy may be retained by the sensitivity measurement processing section 56 or stored in a not-shown storage unit included in the signal processing circuit 50.

The amount of change in the first detection signal Sx when the first additional magnetic field is changed at step S11 will be referred to as a signal change amount dSxhx. The signal change amount dSxhx corresponds to the first data.

The amount of change in the second detection signal Sy when the second additional magnetic field is changed at step S12 will be referred to as a signal change dSyhy. The signal change amount dSyhy corresponds to the second data.

The amount of change in the second detection signal Sy when the first additional magnetic field is changed at step S11 will be referred to as a signal change amount dSyhx. The signal change amount dSyhx corresponds to the third data.

The amount of change in the first detection signal Sx when the second additional magnetic field is changed at step S12 will be referred to as a signal change amount dSxhy. The signal change amount dSxhy corresponds to the fourth data.

The ratio of a change in the first detection signal Sx to a change in the strength of a magnetic field in the first main-axis direction will be referred to as a first main-axis sensitivity, and denoted by the symbol SSxhx. The ratio of a change in the second detection signal Sy to a change in the strength of a magnetic field in the first main-axis direction will be referred to as a cross-axis sensitivity SSyhx.

The ratio of a change in the second detection signal Sy to a change in the strength of a magnetic field in the second main-axis direction will be referred to as a second main-axis sensitivity, and denoted by the symbol SSyhy. The ratio of a change in the first detection signal Sx to a change in the strength of a magnetic field in the second main-axis direction will be referred to as a cross-axis sensitivity SSxhy.

The signal change amounts dSxhx and dSyhx, i.e., the first and third data, are expressed in Eq. (6) below.

$$\begin{pmatrix} dSxhx \\ dSyhx \end{pmatrix} = \begin{pmatrix} SSxhx & SSxhy \\ SSyhx & SSyhy \end{pmatrix} \begin{pmatrix} dHx \\ 0 \end{pmatrix} \quad (6)$$

The signal change amounts dSyhy and dSxhy, i.e., the second and fourth data, are expressed in Eq. (7) below.

$$\begin{pmatrix} dSxhy \\ dSyhy \end{pmatrix} = \begin{pmatrix} SSxhx & SSxhy \\ SSyhx & SSyhy \end{pmatrix} \begin{pmatrix} 0 \\ dHy \end{pmatrix} \quad (7)$$

The 2×2 matrix on the right-hand side of each of Eqs. (6) and (7) will hereinafter be referred to as a sensitivity matrix, and denoted by the symbol MSS.

Next, how to compute the respective sensitivities of the first and second magnetic sensors 10 and 20 at step S13 will be described concretely. The sensitivity measurement processing section 56 computes the sensitivity of the first magnetic sensor 10 to the first additional magnetic field component Hx, i.e, the first main-axis sensitivity SSxhx on the basis of the first data, i.e., the signal change amount dSxhx, and computes the sensitivity of the second magnetic sensor 20 to the first additional magnetic field component Hx, i.e., the cross-axis sensitivity SSyhx on the basis of the third data, i.e., the signal change amount dSyhx. From Eq. (6), SSxhx is determined by dSxhx/dHx, and SSyhx is determined by dSyhx/dHx.

The sensitivity measurement processing section 56 computes the sensitivity of the second magnetic sensor 20 to the second additional magnetic field component Hy, i.e, the second main-axis sensitivity SSyhy on the basis of the second data, i.e., the signal change amount dSyhy, and computes the sensitivity of the first magnetic sensor 10 to the second additional magnetic field component Hy, i.e., the cross-axis sensitivity SSxhy on the basis of the fourth data, i.e., the signal change amount dSxhy. From Eq. (7), SSyhy is determined by dSyhy/dHy, and SSxhy is determined by dSxhy/dHy.

Next, the correction function determination processing by the correction function determination section 57 will be described concretely. The correction function determination section 57 determines a correction coefficient matrix MC by using the sensitivities SSxhx, SSyhy, SSyhx, and SSxhy computed in the sensitivity measurement processing. Here, a first example and a second example of the correction coefficient matrix MC will be described. In the first example, the correction coefficient matrix MC is an inverse matrix $MSS^{-1}$ of the sensitivity matrix MSS.

In the second example, the correction coefficient matrix MC is a matrix in which an ith-row jth-column element is an approximate value of the ith-row jth-column element of the foregoing inverse matrix $MSS^{-1}$. The second example of correction coefficient matrix MC is expressed in Eq. (8)

below, for example. In this example, the approximate value of the ith-row jth-column element of the inverse matrix $MSS^{-1}$ is determined by using the fact that the first and second main-axis sensitivities SSxhx and SSyhy have values close to each other and the cross-axis sensitivities have values close to zero.

$$MC = \begin{pmatrix} C_{11} & C_{12} \\ C_{21} & C_{22} \end{pmatrix} = \begin{pmatrix} \frac{1}{SSxhx} & -SSxhy \\ -SSyhx & \frac{1}{SSyhy} \end{pmatrix} \quad (8)$$

The correction function determination section 57 then determines the correction functions on the basis of the determined correction coefficient matrix MC, and outputs the determined correction functions to the sensitivity correction processing section 55. As described above, the correction functions are expressed in Eqs. (3) and (4) or Eq. (5).

The correction function determination processing is performed after the sensitivity measurement processing. For example, the sensitivity measurement processing may be performed when at least one of a first, a second, or a third activation condition described below is satisfied.

The first activation condition is that a predetermined period of time has elapsed since the last correction function determination processing. The signal processing circuit 50 may include a timer (not shown) for notifying the sensitivity measurement processing section 56 that the predetermined period of time has elapsed.

The second activation condition is that either the first detection signal Sx or the second detection signal Sy has a value in a nonlinear region. Now, linear and nonlinear regions will be described in connection with the first detection signal Sx by way of example. In a graph representing a relationship between the first external magnetic field component and the first detection signal Sx, a point where the strength of the first external magnetic field component corresponds to 0 will be referred to as a point of origin. The range of the first detection signal Sx includes a linear region and first and second nonlinear regions. The linear region is a region including the point of origin. In the linear region, the ratio of a change in the first detection signal Sx to a change in the first external magnetic field component, i.e., the first main-axis sensitivity SSxhx is constant or almost constant. The first and second nonlinear regions are regions where the first main-axis sensitivity SSxhx is different from that in the linear region. The first and second nonlinear regions are on both sides of the linear region. The linear region and the first and second nonlinear regions are determined in advance. The first main-axis sensitivity SSxhx in each of the first and second nonlinear regions can change with changes in the first external magnetic field component.

Similarly, the range of the second detection signal Sy also includes a linear region and first and second nonlinear regions. The signal processing circuit 50 may include a determination section for determining whether the value of the first or second detection signal Sx or Sy is in the first or second nonlinear region or not. If the value of the first or second detection signal Sx or Sy is in the first or second nonlinear region, the second activation condition is satisfied. In such a case, the determination section outputs a notifying signal to the sensitivity measurement processing section 56.

The third activation condition is that either the first detection signal Sx or the second detection signal Sy has a value outside a use range defined in advance. An example of the use range is the range of normal input signals to the A/D converters 51 and 52. In this example, the third activation condition is satisfied if it is detected that a signal outside the use range has been input to the A/D converter 51 or 52. In such a case, the A/D converter 51 or 52 outputs a notifying signal to the sensitivity measurement processing section 56.

Next, the detection signal correction processing by the detection signal correction processing section 54 will be described concretely. The detection signal correction processing section 54 performs, on the first detection signal Sx, first reduction processing for reducing a change component attributable to the first additional magnetic field. The first reduction processing is processing for subtracting a first estimated value Ex, which is an estimated value of the change component attributable to the first additional magnetic field, from the first detection signal Sx to generate the detection signal PSx. As mentioned previously, the detection signal PSx is the same as the detection signal Sx when the sensitivity measurement processing is not performed.

Similarly, the detection signal correction processing section 54 performs, on the second detection signal Sy, second reduction processing for reducing a change component attributable to the second additional magnetic field. The second reduction processing is processing for subtracting a second estimated value Ey, which is an estimated value of the change component attributable to the second additional magnetic field, from the second detection signal Sy to generate the detection signal PSy. As mentioned previously, the detection signal PSy is the same as the detection signal Sy when the sensitivity measurement processing is not performed.

The detection signal correction processing will be described concretely in connection with the first reduction processing by way of example. The following description deals with a case where the first reduction processing is performed with a first external magnetic field component MFx of an almost constant magnitude applied to the first magnetic sensor 10 and with the first additional magnetic field being changed by the sensitivity measurement processing. In the following description, a current that is intended to generate the first additional magnetic field and passed through the coil conductor 61a (see FIG. 7) of the first additional magnetic field generator 61 will be referred to as a first coil current Cx.

Figure 12:
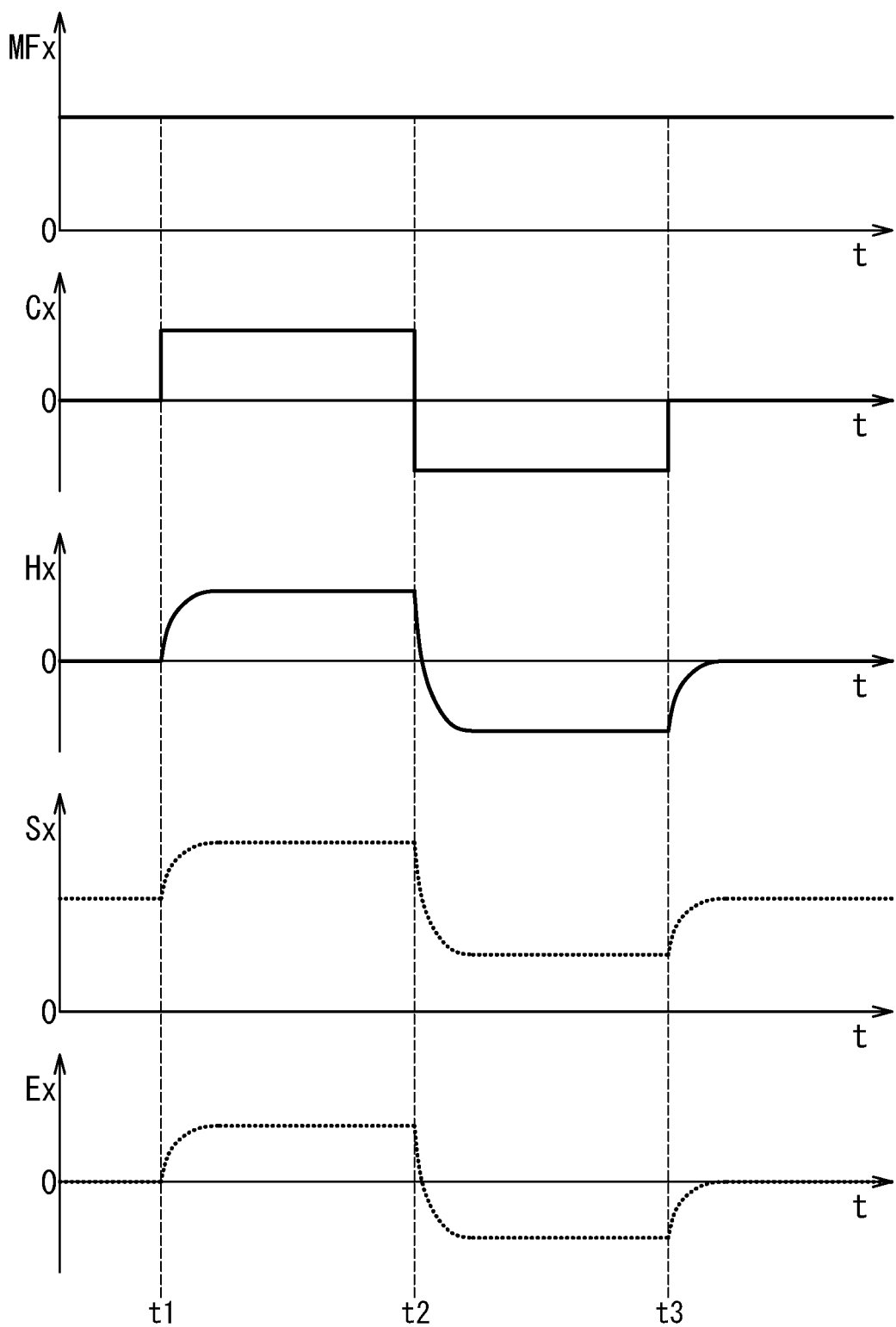
FIG. 12 is an explanatory diagram for describing detection signal correction processing of the first embodiment of the invention.

FIG. 12 illustrates examples of temporal changes in the first external magnetic field component MFx, the first coil current Cx, the first additional magnetic field component Hx, the first detection signal Sx, and the first estimated value Ex. In FIG. 12, the horizontal axis represents time t.

In FIG. 12, the magnitude of the first external magnetic field component MFx directed in the X direction of the first sensor coordinate system is expressed in positive values. The magnitude of the first external magnetic field component MFx directed in the −X direction of the first sensor coordinate system is expressed in negative values. The magnitude of the first additional magnetic field component Hx directed in the X direction of the reference coordinate system is expressed in positive values. The magnitude of the first additional magnetic field component Hx directed in the −X direction of the reference coordinate system is expressed in negative values.

In FIG. 12, the first coil current Cx that causes the first additional magnetic field component Hx to be in the X direction of the reference coordinate system, i.e., the first coil current Cx passed in the direction from the terminal 61b to the terminal 61c of the first additional magnetic field generator 61 is expressed in positive values. The first coil current Cx that causes the first additional magnetic field component Hx to be in the −X direction of the reference coordinate system, i.e., the first coil current Cx passed in the direction from the terminal 61c to the terminal 61b of the first additional magnetic field generator 61 is expressed in negative values.

In FIG. 12, the first detection signal Sx when a magnetic field in the X direction of the first sensor coordinate system is detected is expressed in positive values. The first detection signal Sx when a magnetic field in the −X direction of the first sensor coordinate system is detected is expressed in negative values. The first detection signal Sx is a discrete signal sampled at a predetermined sampling frequency. In FIG. 12, the values of the first detection signal Sx at discrete time instants are represented by dots.

In the example shown in FIG. 12, the value of the first coil current Cx changes from 0 to positive at a time instant t1, from positive to negative at a time instant t2 later than the time instant t1, and from negative to 0 at a time instant t3 later than the time instant t2. In such a case, the magnitude of the first additional magnetic field component Hx starts to increase gradually from 0 at the time instant t1 and then reaches a positive constant value, starts to decrease gradually from the positive constant value at the time instant t2 and then reaches a negative constant value, and starts to increase gradually from the negative constant value at the time instant t3 and then reaches 0.

When the first additional magnetic field is generated, a composite magnetic field of the first external magnetic field component MFx and the first additional magnetic field component Hx is applied to the first magnetic sensor 10. The first detection signal Sx here contains a main component attributable to the first external magnetic field component MFx and a change component attributable to the first additional magnetic field, or specifically, a change component attributable to the first additional magnetic field component Hx. As the first additional magnetic field component Hx changes, the change component of the first detection signal Sx also changes with time t like the first additional magnetic field component Hx. The main component remains almost constant like the first external magnetic field component MFx.

In the present embodiment, the first estimated value Ex is an estimated value of the change component of the first detection signal Sx. Since the first detection signal Sx is a discrete signal, the first estimated value Ex is discrete data. Although not illustrated, the detection signal PSx is a discrete signal. In FIG. 12, values of the first estimated value Ex at discrete time instants are represented by dots. The first estimated value Ex changes with time t like the change component of the first detection signal Sx. The first estimated value Ex is 0 for a period over which the change component of the first detection signal Sx is expected to be 0. The first estimated value Ex at each time instant is determined in advance before shipment or use of the magnetic sensor system 1. For example, the first estimated value Ex at each time instant can be determined before shipment or use of the magnetic sensor system 1 by measuring the first detection signal Sx when the first additional magnetic field is changed by the same procedure as the sensitivity measurement processing. The first estimated value Ex at each time instant may be retained by the detection signal correction processing section 54 or stored in the not-shown storage unit included in the signal processing circuit 50.

The detection signal correction processing section 54 is configured to be able to obtain information concerning the control of the first additional magnetic field generator 61 from the sensitivity measurement processing section 56, for example. The detection signal correction processing section 54 generates the detection signal PSx by performing processing for subtracting the first estimated value Ex corresponding to the change component of the first detection signal Sx from the first detection signal Sx at each discrete time instant in synchronization with the control of the first additional magnetic field generator 61.

The details of the second reduction processing are similar to those of the first reduction processing. The detection signal correction processing section 54 is configured to be able to obtain information concerning the control of the second additional magnetic field generator 62 from the sensitivity measurement processing section 56, for example. The detection signal correction processing section 54 generates the detection signal PSy by performing processing for subtracting the second estimated value Ey corresponding to the change component of the second detection signal Sy from the second detection signal Sy at each discrete time instant in synchronization with the control of the second additional magnetic field generator 62.

The second estimated value Ey at each time instant is determined in advance by the same method as with the first estimated value Ex. The second estimated value Ey at each time instant may be retained by the detection signal correction processing section 54 or stored in the not-shown storage unit included in the signal processing circuit 50.

Next, a description will be given of the effects of the magnetic sensor system 1 according to the present embodiment. As described above, in the sensitivity measurement processing of the present embodiment, the first and second main-axis sensitivities SSxhx and SSyhy are measured on the basis of the data concerning respective changes in the first and second detection signals Sx and Sy obtained when the first and second additional magnetic fields are generated. During execution of the sensitivity measurement processing, a change component attributable to the first additional magnetic field occurs in the first detection signal Sx, and a change component attributable to the second additional magnetic field occurs in the second detection signal Sy. As a result, the first and second detection signals Sx and Sy during execution of the sensitivity measurement processing no longer exactly reflect the first and second external magnetic field components, respectively. If the detection signal correction processing of the present embodiment is not performed, it is thus necessary to perform sensitivity measurement processing by interrupting the normal operations of the first and second magnetic sensors 10 and 20.

In contrast, according to the present embodiment, in the detection signal correction processing the first and second detection signals Sx and Sy are subjected to processing for reducing the respective change components to thereby generate the detection signals PSx and PSy. According to the present embodiment, the detection signals PSx and PSy during execution of the sensitivity measurement processing exactly or almost exactly reflect the first and second external magnetic field components, respectively. The present embodiment thus makes it possible to perform the sensitivity measurement processing without necessitating interruption of the normal operations of the first and second magnetic sensors 10 and 20.

According to the present embodiment, in the sensitivity measurement processing, the first and second additional magnetic fields are each applied to the first and second magnetic sensors 10 and 20 to measure not only the main-axis sensitivities SSxhx and SSyhy but also the cross-axis sensitivities SSyhx and SSxhy. Accordingly, when the first additional magnetic field is generated, a change component attributable to the first additional magnetic field occurs also in the detection signal Sy, and when the second additional magnetic field is generated, a change component attributable to the second additional magnetic field occurs also in the detection signal Sx. Any processing for reducing such change components is not performed in the present embodiment. The reason is that such change components are extremely smaller in magnitude than the detection signals Sx and Sy, and thus do not have much impact on the detection signals PSx and PSy even without the processing for reducing the change components.

Second Embodiment

A second embodiment of the present invention will now be described. A magnetic sensor system 1 according to the present embodiment has a configuration as illustrated in FIG. 2, which is basically the same as the configuration of the magnetic sensor system 1 according to the first embodiment. In the present embodiment, the sensitivity measurement processing by the sensitivity measurement processing section 56 and the detection signal correction processing by the detection signal correction processing section 54 are different from those in the first embodiment.

As has been described in relation to the first embodiment, in performing the sensitivity measurement processing, the sensitivity measurement processing section 56 controls the first and second additional magnetic field generators 61 and 62 (see FIGS. 7 and 8) of the additional magnetic field generation section 60 to generate the first and second additional magnetic fields. In the present embodiment, both the first and second additional magnetic fields are alternating-current magnetic fields.

In the present embodiment, during execution of the sensitivity measurement processing, the first detection signal Sx contains a first alternating-current change component Sx1 attributable to the first additional magnetic field, and the second detection signal Sy contains a second alternating-current change component Sy2 attributable to the second additional magnetic field.

The detection signal correction processing by the detection signal correction processing section 54 in the present embodiment includes performing first filtering processing for reducing the first alternating-current change component Sx1 on the first detection signal Sx, and performing second filtering processing for reducing the second alternating-current change component Sy2 on the second detection signal Sy.

As with the first embodiment, the first and second detection signals having undergone the detection signal correction processing will be referred to as detection signals PSx and PSy, respectively. The detection signal correction processing section 54 outputs the detection signals PSx and PSy to the sensitivity correction processing section 55. When the sensitivity measurement processing is not performed, any change component attributable to the first or second additional magnetic field does not occur in the detection signal Sx or Sy. Therefore, when the sensitivity measurement processing is not performed, the detection signals PSx and PSy are the same or almost the same as the detection signals Sx and Sy, respectively.

Next, the first and second filtering processing by the detection signal correction processing section 54 will be described concretely. The first filtering processing will be described first. The following description deals with a case where the first filtering processing is performed with a first external magnetic field component MFx of an almost constant magnitude applied to the first magnetic sensor 10 and with the first additional magnetic field being changed by the sensitivity measurement processing.

Figure 13:
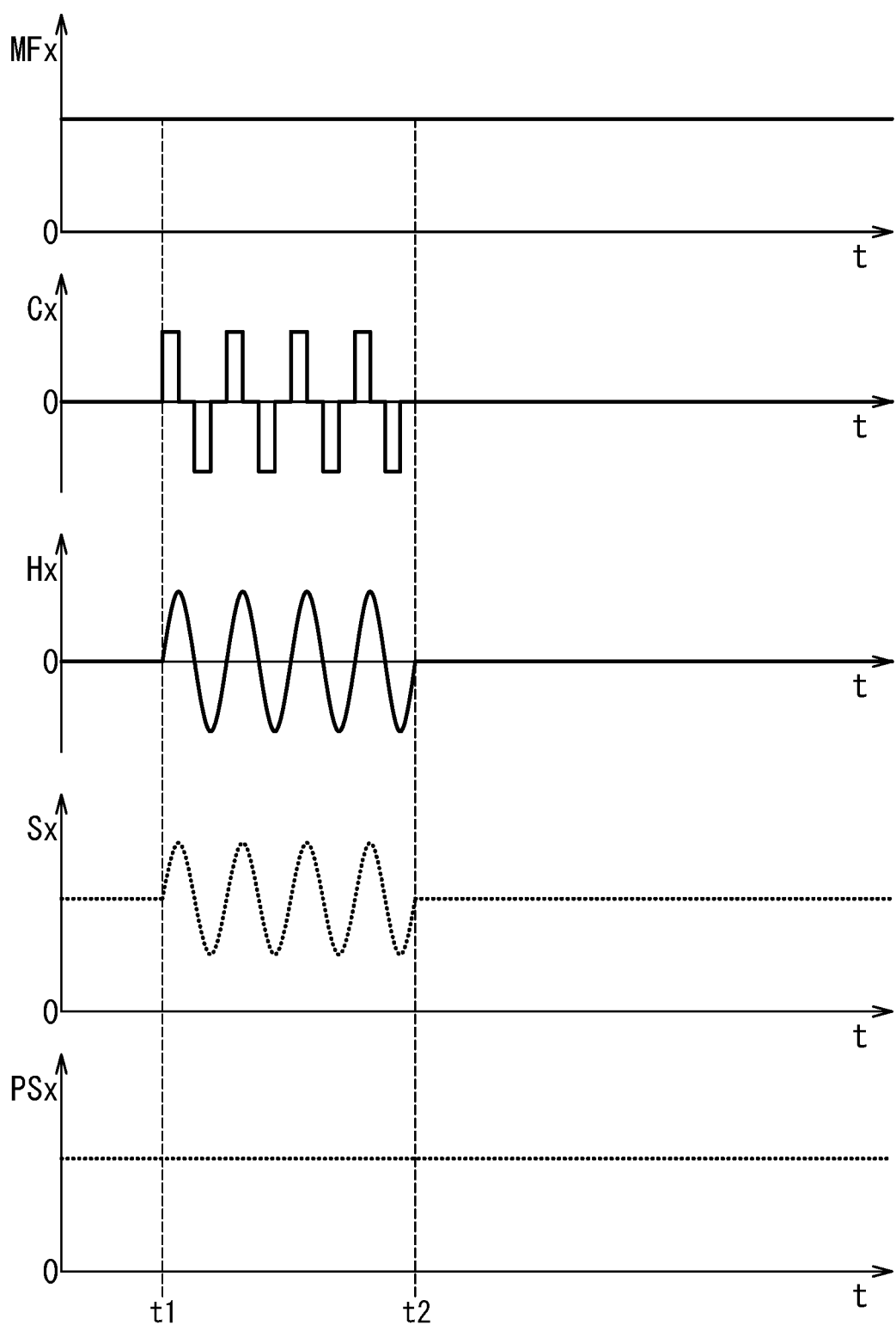
FIG. 13 is an explanatory diagram for describing detection signal correction processing of a second embodiment of the invention.

FIG. 13 illustrates examples of temporal changes in the first external magnetic field component MFx, the first coil current Cx, the first additional magnetic field component Hx, the first detection signal Sx, and the detection signal PSx. In FIG. 13, the horizontal axis represents time t. In FIG. 13, the definitions of the positive and negative values of the first external magnetic field component MFx, the first coil current Cx, the first additional magnetic field component Hx, and the first detection signal Sx are the same as those in FIG. 12 described in relation to the first embodiment. The definitions of the positive and negative values of the detection signal PSx are the same as those of the positive and negative values of the first detection signal Sx.

As in the first embodiment, the first detection signal Sx and the detection signal PSx are discrete signals. In FIG. 13, the values of the first detection signal Sx and the detection signal PSx at discrete time instants are represented by dots.

In the example shown in FIG. 13, the value of the first coil current Cx, which is a current for generating the first additional magnetic field, changes periodically to alternate between positive and negative values during a period from a time instant t1 to a time instant t2 later than the time instant t1. In such a case, the first additional magnetic field component Hx changes periodically to alternate between positive and negative values during the period from the time instant t1 to the time instant t2. The frequency of the periodic changes in the first coil current Cx and the first additional magnetic field component Hx will be denoted by fx.

When the first additional magnetic field is generated, a composite magnetic field of the first external magnetic field component MFx and the first additional magnetic field component Hx is applied to the first magnetic sensor 10. The first detection signal Sx here contains a main component Sxm attributable to the first external magnetic field component MFx and the first change component Sx1. As the first additional magnetic field component Hx changes, the first change component Sx1 also changes periodically at the frequency fx like the first additional magnetic field component Hx. The main component Sxm remains almost constant like the first external magnetic field component MFx.

Figure 14:
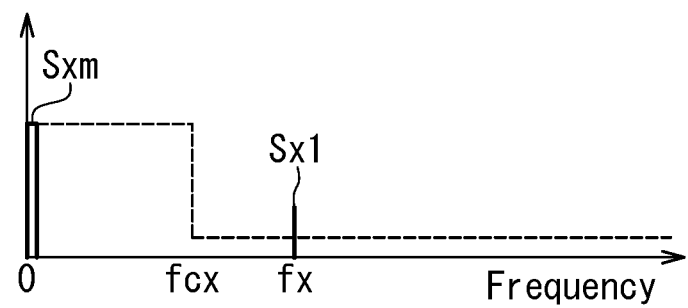
FIG. 14 is an explanatory diagram illustrating a filtering characteristic of the detection signal correction processing of the second embodiment of the invention.

The first filtering processing is processing for passing frequency components of the first detection signal Sx with frequencies lower than or equal to a cutoff frequency fcx and attenuating frequency components with frequencies higher than the cutoff frequency fcx. FIG. 14 is an explanatory diagram illustrating a filtering characteristic of the first filtering processing on the first detection signal Sx. In FIG. 14, the horizontal axis represents frequency. The broken line represents the filtering characteristic of the first filtering processing. The line denoted by the symbol Sxm represents the frequency response of the main component Sxm of the first detection signal Sx1. The line denoted by the symbol Sx1 represents the frequency response of the first change component Sx1. In FIG. 14, the vertical axis represents magnitude for the main component Sxm and the first change component Sx1, and represents gain for the filtering characteristic.

The cutoff frequency fcx is set to a frequency lower than the frequency fx. The first change component Sx1 of the first detection signal Sx is thus significantly reduced to allow the detection signal PSx to be almost the same as the main component Sxm of the first detection signal Sx.

Details of the second filtering processing are similar to those of the first filtering processing. The frequency of the periodic changes in the second additional magnetic field component Hy will be denoted by fy. The frequency fy may be equal to or different from the frequency fx.

The second filtering processing is processing for passing frequency components of the second detection signal Sy with frequencies lower than or equal to a cutoff frequency fcy and attenuating frequency components with frequencies higher than the cutoff frequency fcy. The cutoff frequency fcy is set to a frequency lower than the frequency fy. The second change component Sy2 of the second detection signal Sy is thus significantly reduced to allow the detection signal PSy to be almost the same as the main component Sym of the second detection signal Sy.

The sampling frequency of the first and second detection signals Sx and Sy is sufficiently higher than twice the higher one of the frequencies fx and fy.

When the first additional magnetic field is generated, a change component Sy1 attributable to the first additional magnetic field occurs in the detection signal Sy. When the second additional magnetic field is generated, a change component Sx2 attributable to the second additional magnetic field occurs in the detection signal Sx.

In the present embodiment, the change component Sx2 of the first detection signal Sx is also reduced by the first filtering processing. Furthermore, the change component Sy1 of the second detection signal Sy is also reduced by the second filtering processing.

Next, the sensitivity measurement processing in the present embodiment will be described concretely. The sensitivity measurement processing section 56 obtains first and third data concerning respective changes in the first and second detection signals Sx and Sy when the first additional magnetic field is changed. The sensitivity measurement processing section 56 also obtains second and fourth data concerning respective changes in the second and first detection signals Sy and Sx when the second additional magnetic field is changed. The sensitivity measurement processing section 56 then computes the sensitivities of the first and second magnetic sensors 10 and 20 on the basis of the first to fourth data obtained.

In the present embodiment, both the first and second additional magnetic fields are alternating-current magnetic fields. In such a case, temporal changes in the first and second additional magnetic field components Hx and Hy are expressed as alternating-current waveforms.

Temporal changes in the respective change components Sx1 and Sy1 of the first and second detection signals Sx and Sy when the first additional magnetic field is generated are expressed as alternating-current waveforms. Similarly, temporal changes in the respective change components Sx2 and Sy2 of the first and second detection signals Sx and Sy when the second additional magnetic field is generated are also expressed as alternating-current waveforms.

In the present embodiment, the peak-to-peak value of the first additional magnetic field component Hx is defined as dHx. The peak-to-peak value of the second additional magnetic field component Hy is defined as dHy.

For example, dHx and dHy can be determined before shipment or use of the magnetic sensor system 1 by measuring the first and second additional magnetic field components Hx and Hy when the first and second additional magnetic fields are changed. dHx and dHy may be retained by the sensitivity measurement processing section 56 or stored in a not-shown storage unit included in the signal processing circuit 50.

In the present embodiment, the peak-to-peak value of the first change component Sx1 is defined as the signal change amount dSxhx, and the peak-to-peak value of the second change component Sy2 as the signal change amount dSyhy. As has been described in relation to the first embodiment, the signal change amounts dSxhx and dSyhy correspond to the first and second data, respectively.

In the present embodiment, the peak-to-peak value of the change component Sy1 is defined as the signal change amount dSyhx. As has been described in relation to the first embodiment, the signal change amount dSyhx corresponds to the third data.

In the present embodiment, the peak-to-peak value of the change component Sx2 is defined as the signal change amount dSxhy. As has been described in relation to the first embodiment, the signal change amount dSxhy corresponds to the fourth data.

The sensitivity measurement processing generates the first to fourth data by measuring the peak-to-peak values of the foregoing four change components on the basis of the first and second detection signals Sx and Sy obtained during execution of the sensitivity measurement processing.

The sensitivity measurement processing computes the sensitivities of the first and second magnetic sensors 10 and 20 on the basis of the first to fourth data, i.e., the signal change amounts dSxhx, dSyhy, dSyhx and dSxhy, and also dHx and dHy. The specific method of computing the sensitivities is the same as that in the first embodiment.

The effects of the magnetic sensor system 1 according to the present embodiment will now be described. In the present embodiment, during execution of the sensitivity measurement processing, the first alternating-current change component Sx1 occurs in the first detection signal Sx, and the second alternating-current change component Sy2 occurs in the second detection signal Sy. In the present embodiment, the first detection signal Sx is subjected to the first filtering processing for reducing the first alternating-current change component Sx1, and the second detection signal Sy is subjected to the second filtering processing for reducing the second alternating-current change component Sy2. This causes, as in the first embodiment, the detection signals PSx and PSy during execution of the sensitivity measurement processing to exactly or almost exactly reflect the first and second external magnetic field components, respectively. The present embodiment thus makes it possible to perform the sensitivity measurement processing without necessitating interruption of the normal operations of the first and second magnetic sensors 10 and 20.

In the present embodiment, as described above, the first filtering processing also reduces the change component Sx2 in the first detection signal Sx, and the second filtering processing also reduces the change component Sy1 in the second detection signal Sy. Consequently, the present embodiment allows the detection signals PSx and PSy during execution of the sensitivity measurement processing to more exactly reflect the first and second external magnetic field components, respectively.

The configuration, operation and effects of the present embodiment are otherwise the same as those of the first embodiment.

Third Embodiment

A third embodiment of the present invention will now be described. First, a magnetic sensor system according to the present embodiment will be outlined with reference to FIG. 15 and FIG. 16. The magnetic sensor system 70 according to the present embodiment is configured to detect the position of an object that is movable linearly.

Figure 15:
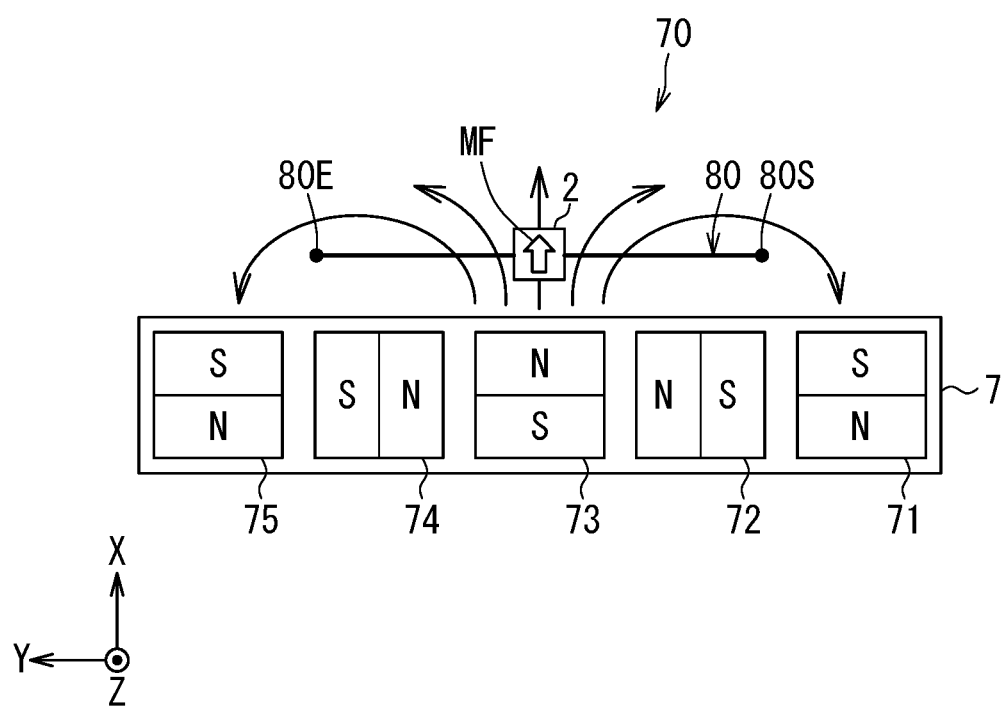
FIG. 15 is a plan view illustrating a target magnetic field generation section and a magnetic sensor device of a third embodiment of the invention.
Figure 16:
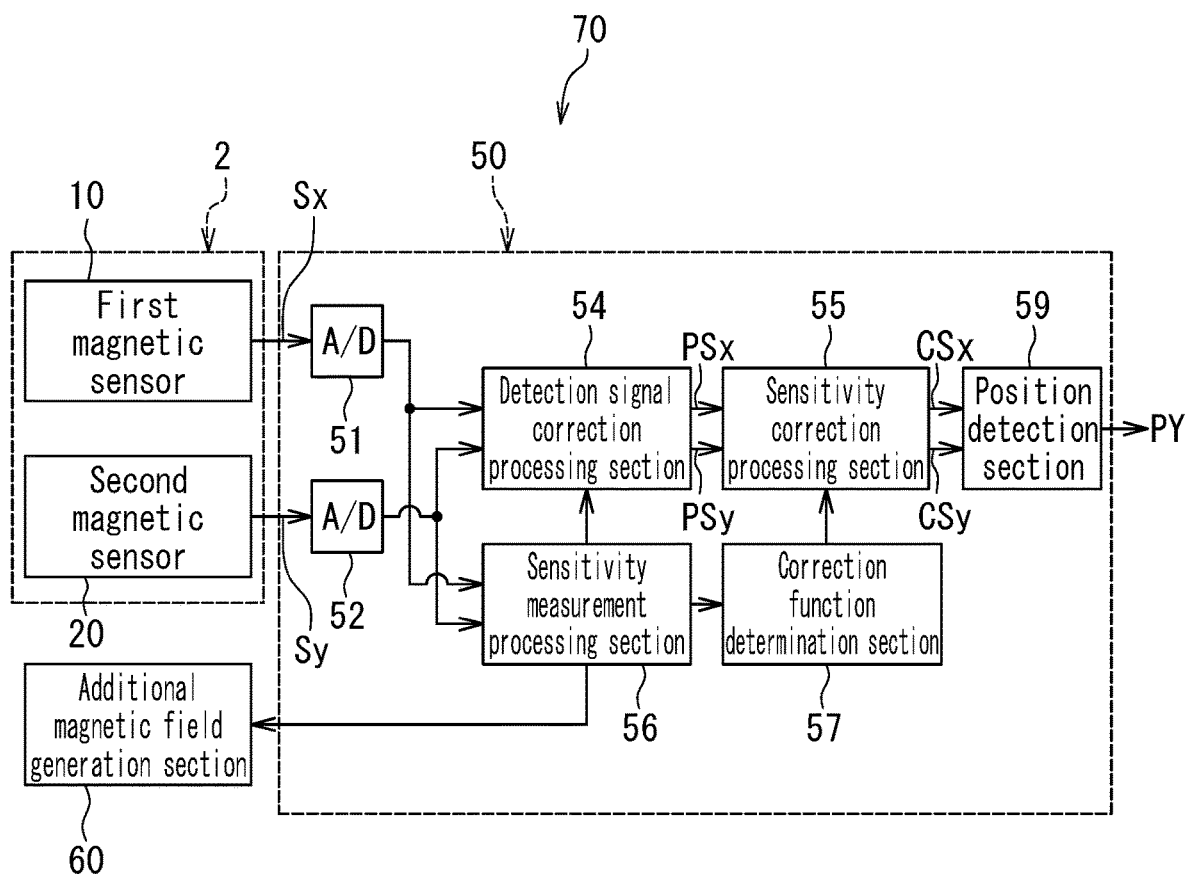
FIG. 16 is a block diagram illustrating a configuration of a magnetic sensor system according to the third embodiment of the invention.

As shown in FIG. 16, the magnetic sensor system 70 includes a magnetic sensor device 2, an additional magnetic field generation section 60, and a signal processing circuit 50. As shown in FIG. 15, the magnetic sensor system 70 further includes a target magnetic field generation section 7.

The target magnetic field generation section 7 includes a Halbach array of five magnets 71, 72, 73, 74, and 75. The five magnets 71, 72, 73, 74, and 75 are arranged in this order in the Y direction of the reference coordinate system. Each of the magnets 71 to 75 has an N pole and an S pole. Each of the magnets 71 to 75 is magnetized in the direction from the S pole to the N pole inside the magnet.

The magnet 71 is magnetized in the -X direction. The magnet 72 is magnetized in the Y direction. The magnet 73 is magnetized in the X direction. The magnet 74 is magnetized in the -Y direction. The magnet 75 is magnetized in the -X direction.

The magnetic sensor device 2 is located forward of the target magnetic field generation section 7 in the X direction and configured to move in the Y direction along with the movement of the object. In FIG. 15, the line segment designated by the reference numeral 80 represents the movable range of the magnetic sensor device 2. The point designated by the reference sign 80S represents one end of the movable range 80, and the point designated by the reference sign 80E represents the other end of the movable range 80.

The target magnetic field generation section 7 generates a magnetic field. In FIG. 15, the arrowed straight line and the arrowed curves drawn near the target magnetic field generation section 7 represent magnetic lines of force corresponding to the magnetic field generated by the target magnetic field generation section 7. If the magnetic sensor device 2 changes its position within the movable range 80, the magnetic field that is generated by the target magnetic field generation section 7 and received by the magnetic sensor device 2 changes direction. In the present embodiment, the magnetic field that is generated by the target magnetic field generation section 7 and received by the magnetic sensor device 2 is the target magnetic field MF. It is possible to detect the position of the magnetic sensor device 2 by detecting the direction of the target magnetic field MF using the magnetic sensor device 2. This makes it possible to detect the position of the object.

As shown in FIG. 16, the signal processing circuit 50 of the present embodiment includes a position detection section 59 in place of the angle detection section 58 of the signal processing circuit 50 of the first embodiment. Based on the first and second corrected signals CSx and CSy, the position detection section 59 generates a position detection value PY indicating the position of the magnetic sensor device 2.

Figure 17:
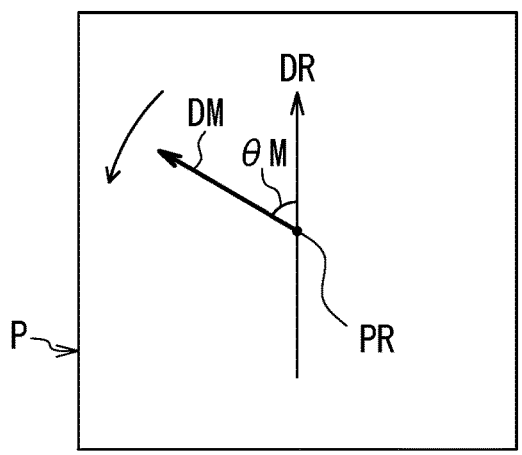
FIG. 17 is an explanatory diagram illustrating a reference plane for the third embodiment of the invention.
Figure 17:
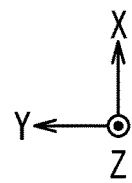

Reference is now made to FIG. 17 to describe a reference plane P, a reference position PR, a reference direction DR, and a target magnetic field angle θM in the present embodiment. The reference plane P in the present embodiment is an XY plane intersecting the magnetic sensor device 2. The reference position PR is a position at which the magnetic sensor device 2 detects the target magnetic field MF. The reference direction DR is in the reference plane P and intersects the reference position PR. The direction DM of the target magnetic field MF at the reference position PR is also in the reference plane P. The target magnetic field angle θM is an angle that the direction of the target magnetic field MF at the reference position PR in the reference plane P forms with respect to the reference direction DR.

In the present embodiment, the reference direction DR is the X direction of the reference coordinate system, as in the first embodiment. In the reference plane P, the direction DM of the target magnetic field MF rotates around the reference position PR. As in the first embodiment, the target magnetic field angle θM is expressed as a positive value when viewed counterclockwise from the reference direction DR in FIG. 17, and as a negative value when viewed clockwise from the reference direction DR in FIG. 17.

Figure 18:
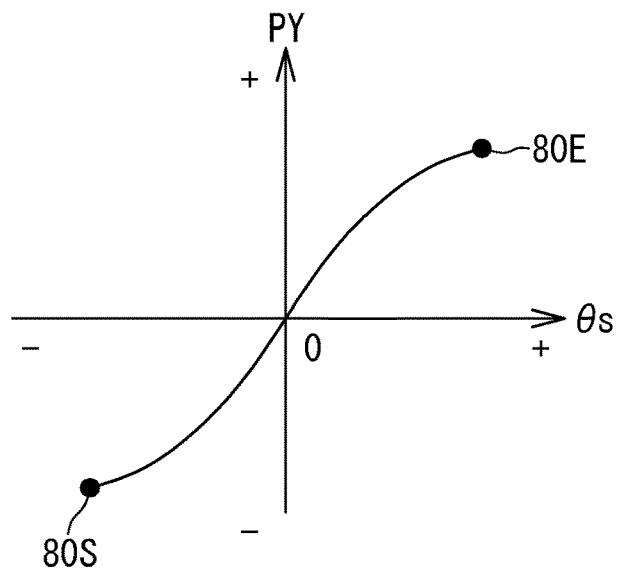
FIG. 18 is a characteristic chart illustrating a relationship between an angle detection value and a position detection value in the third embodiment of the invention.

In the present embodiment, the target magnetic field angle θM has a correspondence with the position of the magnetic sensor device 2. The position detection section 59 shown in FIG. 16 initially generates an angle detection value θs, which indicates the target magnetic field angle θM, in a manner similar to that in which the angle detection section 58 of the first embodiment does. The position detection section 59 then converts the angle detection value θs into a position detection value PY. FIG. 18 is a characteristic chart showing an example of a relationship between the angle detection value θs and the position detection value PY. In FIG. 18 the horizontal axis represents the angle detection value θs, and the vertical axis represents the position detection value PY. In FIG. 18 the point designated by the reference sign 80S corresponds to the end 80S of the movable range 80 in FIG. 15, and the point designated by the reference sign 80E corresponds to the other end 80E of the movable range 80 in FIG. 15. In the example shown in FIG. 18, the position detection value PY is 0 when the angle detection value θs is 0, has a positive value when the angle detection value θs has a positive value, has a negative value when the angle detection value θs has a negative value, and increases as the angle detection value θs increases.

The position detection section 59 stores information indicating a relationship between the angle detection value θs and the position detection value PY such as one shown in FIG. 18, and converts the angle detection value θs into the position detection value PY based on the information.

The configuration of the signal processing circuit 50 in the present embodiment is otherwise the same as that of the signal processing circuit 50 in the first embodiment. The magnetic sensor device 2 in the present embodiment has the same configuration as that in the first embodiment.

In the present embodiment, the angle detection value θs is generated by using the first and second corrected signals CSx and CSy as in the first embodiment. An error occurring in the angle detection value θs is thereby reduced, compared to the case where the angle detection value θs is generated by using the first and second detection signals Sx and Sy. As a result, the present embodiment makes it possible to reduce an error occurring in the position detection value PY, compared to the case where the position detection value PY is generated by using the first and second detection signals Sx and Sy.

The configuration, operation and effects of the present embodiment are otherwise the same as those of the first embodiment.

Fourth Embodiment

Figure 19:
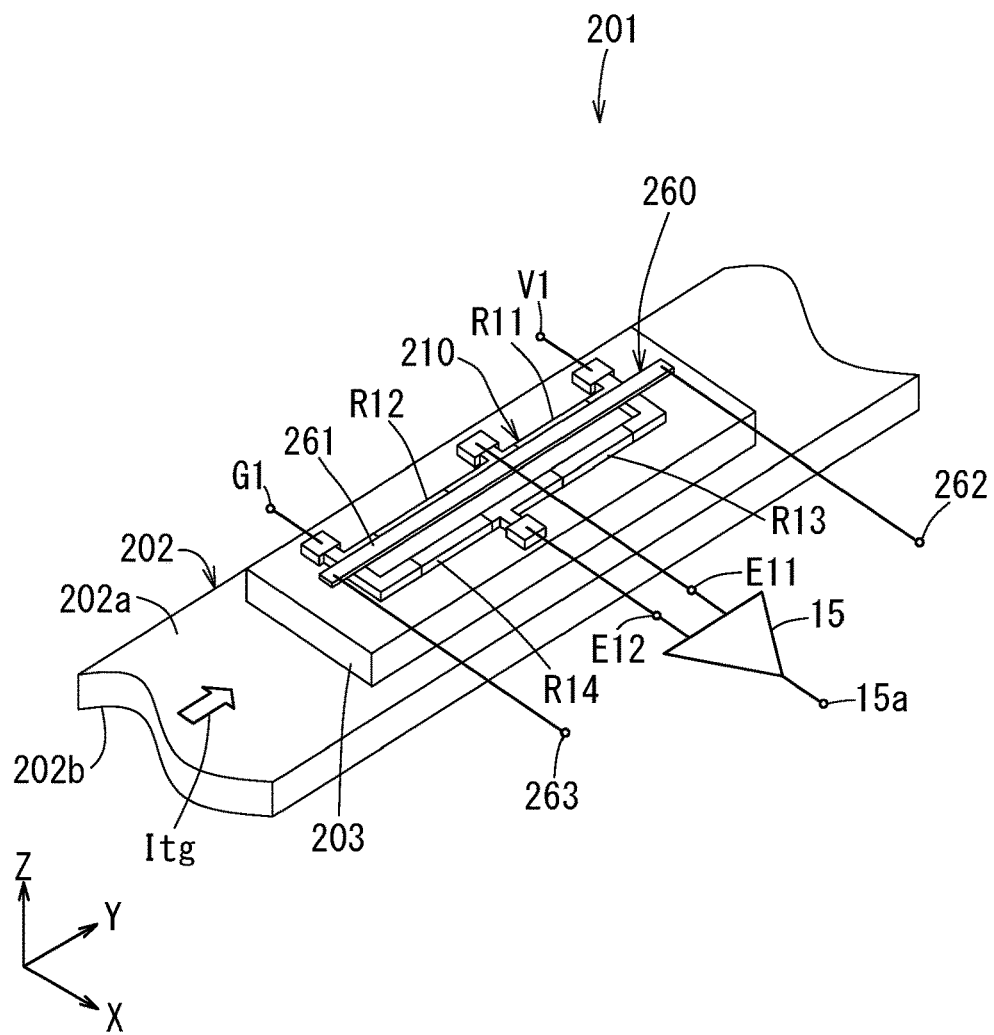
FIG. 19 is a perspective view illustrating a magnetic sensor and an additional magnetic field generation section of a fourth embodiment of the invention.

A fourth embodiment of the present invention will now be described. First, a magnetic sensor system according to the present embodiment will be outlined with reference to FIG. 19 and FIG. 20. The magnetic sensor system 201 according to the present embodiment is configured to detect the value of a current to be detected flowing through a conductor. Hereinafter, the current to be detected will be referred to as a target current Itg. The magnetic sensor system 201 detects the value of the target current Itg by detecting a magnetic field generated by the target current Itg. FIG. 19 illustrates an example in which the conductor through which the target current Itg flows is a bus bar 202. The bus bar 202 has a top surface 202a and a bottom surface 202b.

Figure 20:
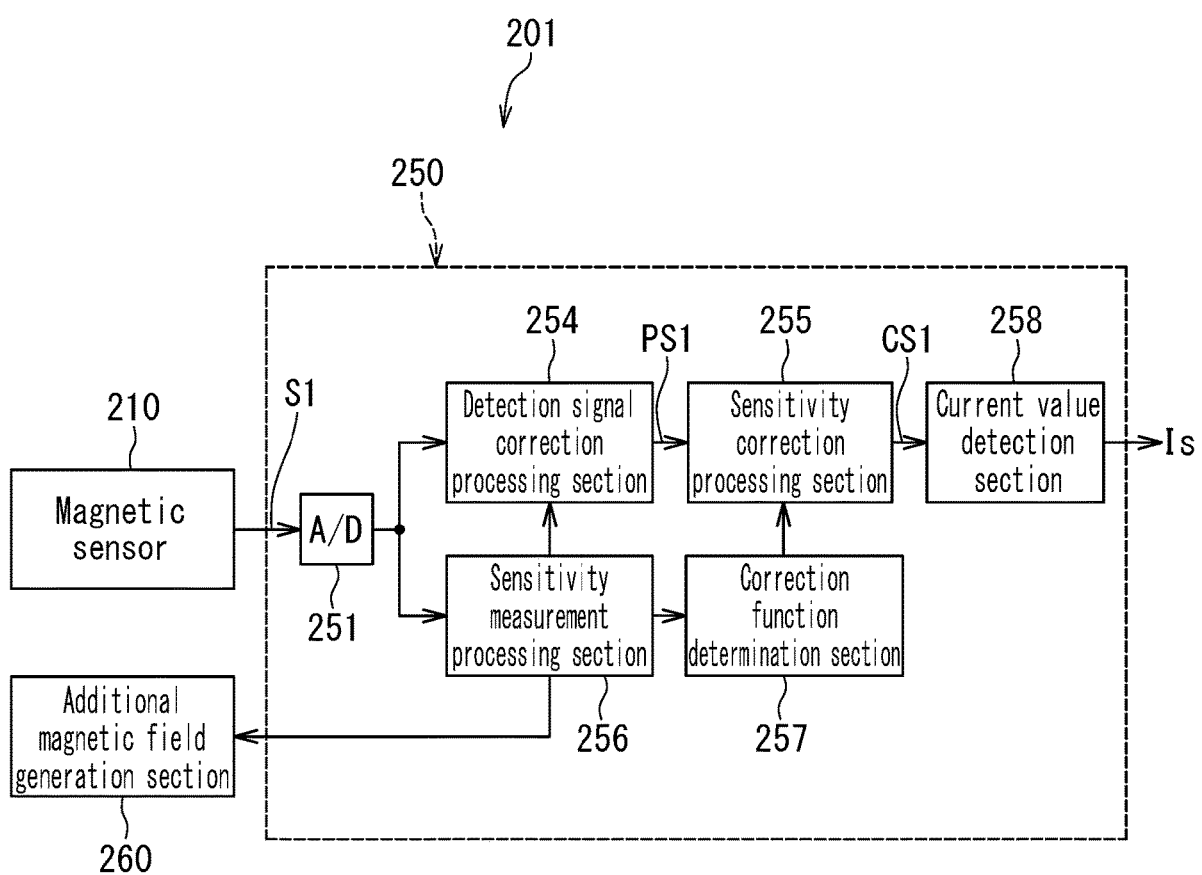
FIG. 20 is a block diagram illustrating a configuration of a magnetic sensor system according to the fourth embodiment of the invention.

As shown in FIG. 20, the magnetic sensor system 201 includes a magnetic sensor 210, an additional magnetic field generation section 260, and a signal processing circuit 250. The additional magnetic field generation section 260 is capable of generating an additional magnetic field for use in measuring the sensitivity of the magnetic sensor 210.

As shown in FIG. 19, the magnetic sensor 210 and the additional magnetic field generation section 260 are stacked in this order on a substrate 203 of an insulating material, and integrated with each other. The substrate 203 is disposed on the top surface 202a of the bus bar 202.

Now, the X, Y, and Z directions in the present embodiment will be described with reference to FIG. 19. The X, Y, and Z directions are orthogonal to each other. The Z direction is perpendicular to the top surface 202a of the bus bar 202 and directed from the bottom surface 202b to the top surface 202a. The Y direction is the longitudinal direction of the bus bar 202 and also the direction of the target current Itg shown in FIG. 19. The X direction is a direction parallel to the top surface 202a of the bus bar 202 and orthogonal to the longitudinal direction of the bus bar 202. The opposite direction to the X direction is defined as the −X direction, and the opposite direction to the Y direction as the −Y direction.

When the target current Itg is passed through the bus bar 202, the bus bar 202 generates a magnetic field around it. The magnetic sensor 210 is located at a position where the magnetic field is detectable. Hereinafter, the magnetic field that is generated by the bus bar 202 and detected by the magnetic sensor 210 will be referred to as a target magnetic field. The target magnetic field corresponds to the external magnetic field in the present invention. The magnetic sensor 210 generates a detection signal S1 having a correspondence with a component in a predetermined direction of the target magnetic field. The predetermined direction is a direction parallel to the X direction. Hereinafter, a component in a direction parallel to the X direction of the target magnetic field will be referred to as a target magnetic field component Htg.

Figure 21:
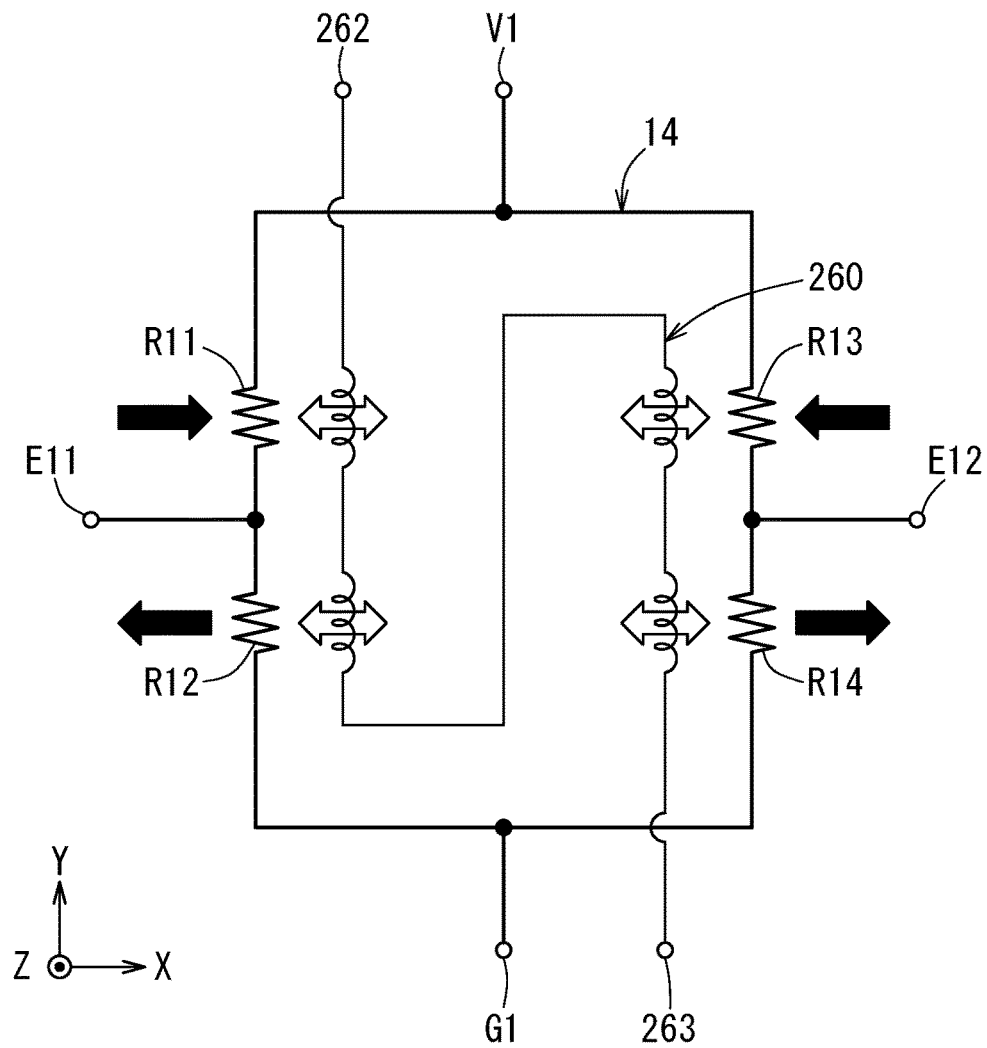
FIG. 21 is a circuit diagram illustrating the magnetic sensor and the additional magnetic field generation section of the fourth embodiment of the invention.

Next, a configuration of the magnetic sensor 210 will be described with reference to FIG. 19 and FIG. 21. The configuration of the magnetic sensor 210 is basically the same as that of the first magnetic sensor 10 of the first embodiment. Specifically, the magnetic sensor 210 includes a Wheatstone bridge circuit 14 shown in FIG. 21 and a difference detector 15 shown in FIG. 19. As shown in FIG. 21, the Wheatstone bridge circuit 14 includes four magnetic detection elements R11, R12, R13 and R14, a power supply port V1, a ground port G1, and two output ports E11 and E12. The magnetic detection element R11 is provided between the power supply port V1 and the output port E11. The magnetic detection element R12 is provided between the output port E11 and the ground port G1. The magnetic detection element R13 is provided between the power supply port V1 and the output port E12. The magnetic detection element R14 is provided between the output port E12 and the ground port G1. A power supply voltage of predetermined magnitude is applied to the power supply port V1. The ground port G1 is connected to ground. As shown in FIG. 19, the difference detector 15 has an output 15a. The difference detector 15 outputs a signal corresponding to a potential difference between the output ports E11 and E12 as the detection signal S1 from the output 15a. The detection signal S1 may be one obtained by adjusting the amplitude or offset of the potential difference between the output ports E11 and E12.

As in the first embodiment, the magnetic detection elements R11 to R14 may each include a plurality of MR elements connected in series. Each of the plurality of MR elements is a spin-valve MR element, for example. In FIG. 21, the filled arrows indicate the magnetization directions of the magnetization pinned layers of the MR elements. In each MR element, the free layer has a uniaxial magnetic anisotropy that sets the direction of the magnetization easy axis to be orthogonal to the magnetization direction of the magnetization pinned layer. The uniaxial magnetic anisotropy may be shape magnetic anisotropy.

The magnetization pinned layers of the MR elements included in the magnetic detection elements R11 and R14 are magnetized in the X direction, and the magnetization pinned layers of the MR elements included in the magnetic detection elements R12 and R13 are magnetized in the −X direction. In the MR elements in the magnetic sensor 210, the angle that the magnetization direction of the free layer forms with respect to the magnetization direction of the magnetization pinned layer varies depending on the strength Btg of the target magnetic field component Htg. As a result, the detection signal S1 varies depending on the strength Btg.

As described above, the detection signal S1 has a correspondence with the target magnetic field component Htg. The target magnetic field component Htg has a correspondence with the value of the target current Itg. The detection signal S1 therefore has a correspondence with the value of the target current Itg. For example, the value of the detection signal S1 is proportional to the value of the target current Itg.

Next, the additional magnetic field generation section 260 will be described with reference to FIG. 19 and FIG. 21. As shown in FIG. 19, the additional magnetic field generation section 260 includes a conductor portion 261 formed of a conductor and elongated in the Y direction, and current supply ports 262 and 263. The current supply port 262 is connected to one end of the conductor portion 261 in the longitudinal direction, and the current supply port 263 is connected to the other end of the conductor portion 261 in the longitudinal direction. The conductor portion 261 is located near the magnetic detection elements R11 to R14. When a current is supplied to the conductor portion 261 from the current supply port 262 or 263, the conductor portion 261 generates the additional magnetic field around the conductor portion 261. The additional magnetic field is applied to the magnetic sensor 210. The additional magnetic field contains a component in a direction parallel to the X direction. The component will hereinafter be referred to as an additional magnetic field component. In FIG. 21, the conductor portion 261 is represented by four inductor symbols. The four hollow arrows in FIG. 21 each represent the additional magnetic field component. The additional magnetic field component is in the same direction and has the same strength at the respective positions of the magnetic detection elements R11 to R14.

Next, the signal processing circuit 250 will be described with reference to FIG. 20. The signal processing circuit 250 controls the additional magnetic field generation section 260 and processes the detection signal S1. The signal processing circuit 250 is constructed of an application-specific integrated circuit (ASIC) or a microcomputer, for example. The signal processing circuit 250 includes an A/D converter 251, a detection signal correction processing section 254, a sensitivity correction processing section 255, a sensitivity measurement processing section 256, a correction function determination section 257, and a current value detection section 258.

The output 15a of the difference detector 15 shown in FIG. 19 is connected to an input of the A/D converter 251. The A/D converter 251 converts the detection signal S1 outputted from the output 15a into a digital signal and outputs the digital signal to the detection signal correction processing section 254 and the sensitivity measurement processing section 256. The detection signal correction processing section 254, the sensitivity correction processing section 255, the sensitivity measurement processing section 256, the correction function determination section 257, and the current value detection section 258 are functional blocks for performing processing described below.

The detection signal correction processing section 254 performs detection signal correction processing. The sensitivity correction processing section 255 performs sensitivity correction processing. The sensitivity measurement processing section 256 performs sensitivity measurement processing. The correction function determination section 257 performs correction function determination processing. The current value detection section 258 performs processing for generating a current detection value Is, which is a detection value of the target current Itg.

The current supply ports 262 and 263 shown in FIG. 19 and FIG. 21 are connected to the signal processing circuit 250. The sensitivity measurement processing section 256 controls the additional magnetic field generation section 260 through the current supply ports 262 and 263.

The sensitivity measurement processing by the sensitivity measurement processing section 256 includes obtaining change data and measuring the sensitivity of the magnetic sensor 210 on the basis of the change data obtained. The change data is data concerning a change in the detection signal S1 when the additional magnetic field generation section 260 is controlled to generate the additional magnetic field. The sensitivity measurement processing section 256 outputs the measurement result of the sensitivity of the magnetic sensor 210 obtained by the sensitivity measurement processing to the correction function determination section 257.

The detection signal correction processing by the detection signal correction processing section 254 includes performing processing for reducing a change component attributable to the additional magnetic field on the detection signal S1. Details of the detection signal correction processing in the present embodiment may be the same as those of the processing that is performed on the first detection signal Sx in the detection signal correction processing in the first embodiment, or the same as those of the processing that is performed on the first detection signal Sx in the detection signal correction processing in the second embodiment.

Hereinafter, the detection signal having undergone the detection signal correction processing will be referred to as a detection signal PS1. The detection signal correction processing section 254 outputs the detection signal PS1 to the sensitivity correction processing section 255. When the sensitivity measurement processing is not performed, any change component attributable to the additional magnetic field does not occur in the detection signal S1. Therefore, when the sensitivity measurement processing is not performed, the detection signal PS1 is the same as the detection signal S1.

The correction function determination processing by the correction function determination section 257 includes determining a correction function for correcting the detection signal PS1 in the sensitivity correction processing. The correction function is determined on the basis of the measurement results of the sensitivity of the magnetic sensor 210 obtained by the sensitivity measurement processing.

The sensitivity correction processing by the sensitivity correction processing section 255 is processing for correcting the detection signal PS1 to generate a corrected signal CS1. The corrected signal CS1 is expressed in Eq. (9) below.

$$CS1 = C1 \cdot PS1 \qquad (9)$$

In Eq. (9), C1 represents a correction coefficient. Eq. (9) represents a correction function.

The current value detection section 258 converts the corrected signal CS1 into the current detection value Is on the basis of the correspondence between the value of the target current Itg and the corrected signal CS1 determined in advance.

Next, the sensitivity measurement processing by the sensitivity measurement processing section 256 will be described concretely. In the following description, the additional magnetic field component applied to the magnetic sensor 210 when the additional magnetic field is generated will be denoted by the symbol H1.

The sensitivity measurement processing starts with controlling the additional magnetic field generation section 260 to generate and change the additional magnetic field, followed by obtaining the foregoing change data. For example, the additional magnetic field may be changed so that the additional magnetic field component H1 in the X direction and the additional magnetic field component H1 in the −X direction are applied to the magnetic sensor 210 at different timings. The sensitivity measurement processing then proceeds to computing the sensitivity of the magnetic sensor 210 on the basis of the change data obtained.

The amount of change in the additional magnetic field component H1 applied to the magnetic sensor 210 when the additional magnetic field is changed will be denoted by the symbol dH1. For example, dH1 can be determined before shipment or use of the magnetic sensor system 201 by measuring the additional magnetic field component H1 when the additional magnetic field is changed. dH1 may be retained by the sensitivity measurement processing section 256 or stored in a not-shown storage unit included in the signal processing circuit 250.

The amount of change in the detection signal S1 when the additional magnetic field is changed will be referred to as a signal change amount dS1. The signal change amount dS1 corresponds to the change data. The ratio of a change in the detection signal S1 to a change in the strength of a magnetic field in a direction parallel to the X direction will be referred to as a sensitivity of the magnetic sensor 210, and denoted by the symbol SS1.

The sensitivity measurement processing includes determining the signal change amount dS1, and determining the sensitivity SS1 of the magnetic sensor 210 by Eq. (10) below.

$$SS1 = dS1/dH1 \qquad (10)$$

The correction function determination processing by the correction function determination section 257 includes determining the coefficient C1 by using the sensitivity SS1 computed in the sensitivity measurement processing. The correction coefficient C1 is expressed in, for example, Eq. (11) below.

$$C1 = 1/SS1 \quad (11)$$

The sensitivity correction processing by the sensitivity correction processing section 255 includes generating the corrected signal CS1 in accordance with the foregoing Eq. (9).

The effects of the magnetic sensor system 201 according to the present embodiment will now be described. First, a description will be given of the effects of the sensitivity measurement processing, the correction function determination processing, and the sensitivity correction processing. Suppose that the correspondence between the value of the target current Itg and the target magnetic field component Htg is constant. A change in the sensitivity SS1 causes a change in the correspondence between the target magnetic field component Htg and the detection signal S1, which in turn changes the correspondence between the value of the target current Itg and the detection signal S1.

Figure 22:
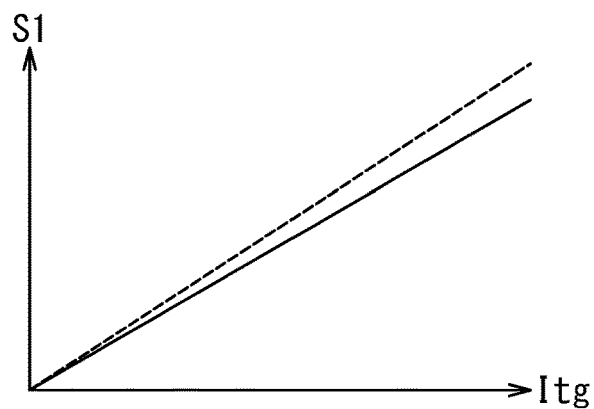
FIG. 22 is a characteristic chart illustrating an example of a correspondence between the value of a target current and a detection signal in the fourth embodiment of the invention.

FIG. 22 illustrates an example of the correspondence between the value of the target current Itg and the detection signal S1. In FIG. 22, the horizontal axis represents the value of the target current Itg, and the vertical axis represents the value of the detection signal S1. In FIG. 22, the solid line represents a correspondence between the value of the target current Itg and the detection signal S1 as designed. In FIG. 22, the broken line represents a correspondence between the value of the target current Itg and the detection signal S1 that has been changed from the correspondence represented by the solid line due to a change in the sensitivity SS1. When the sensitivity measurement processing is not performed, the correspondence between the value of the target current Itg and the detection signal PS1 is the same as that between the value of the target current Itg and the detection signal S1.

If the detection signal S1 is converted to generate the current detection value Is on the basis of the correspondence between the value of the target current Itg and the detection signal S1 with the assumption that the correspondence is constant, a change in the sensitivity SS1 produces an error in the current detection value Is.

In the sensitivity correction processing, the corrected signal CS1 expressed in Eq. (9) is generated by using the correction coefficient C1 determined on the basis of the sensitivity SS1 obtained by the sensitivity measurement processing. The correspondence between the value of the target current Itg and the corrected signal CS1 remains unchanged or hardly changes with a change in the sensitivity SS1. The present embodiment thus makes it possible to reduce or eliminate an error in the current detection value Is attributable to a change in the sensitivity SS1.

Next, the effects of the detection signal correction processing will be described. During execution of the sensitivity measurement processing, a change component attributable to the additional magnetic field occurs in the detection signal S1. The detection signal S1 during the execution of the sensitivity measurement processing thus no longer exactly reflects the target magnetic field component Htg. If the detection signal correction processing is not performed, it is thus necessary to perform sensitivity measurement processing by interrupting the normal operations of the magnetic sensor 210.

In contrast, according to the present embodiment, the detection signal correction processing generates the detection signal PS1 by performing processing for reducing a change component on the detection signal S1. As a result, the detection signal PS1 during execution of the sensitivity measurement processing exactly or almost exactly reflects the target magnetic field component Htg. The present embodiment thus makes it possible to perform the sensitivity measurement processing without necessitating interruption of the normal operations of the magnetic sensor 210.

The configuration, operation and effects of the present embodiment are otherwise the same as those of the first or second embodiment.

The present invention is not limited to the foregoing embodiments, and various modifications may be made thereto. For example, the magnetic sensor system of the present invention may include a third magnetic sensor in addition to the first and second magnetic sensors as the at least one magnetic sensor, the third magnetic sensor generating a third detection signal having a correspondence with a third external magnetic field component, i.e., a component in a third sensing direction of the external magnetic field. In such a case, the additional magnetic field generation section may be capable of generating not only the first and second additional magnetic fields but also a third additional magnetic field for use in measuring the sensitivity of the third magnetic sensor. The sensitivity measurement processing may include obtaining third data concerning a change in the third detection signal when the additional magnetic field generation section is controlled to generate the third additional magnetic field, and measuring the sensitivity of the third magnetic sensor to the third additional magnetic field component on the basis of the third data. The detection signal correction processing may include performing processing for reducing a change component attributable to the third additional magnetic field on the third detection signal.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:
1. A magnetic sensor system comprising:
   at least one magnetic sensor configured to generate a first detection signal (i) having a correspondence with a component in a predetermined direction of an external magnetic field and (ii) that is a first discrete signal;
   a magnetic field generation section configured to generate at least one additional magnetic field for use in measuring a sensitivity of the at least one magnetic sensor; and
   a signal processing circuit configured to control the magnetic field generation section and process the first detection signal of the at least one magnetic sensor, wherein
   the signal processing circuit is configured to sample the first detection signal at a predetermined sampling frequency, and perform sensitivity measurement processing, detection signal correction processing, and sensitivity correction processing,
   the sensitivity measurement processing includes obtaining concerning a change in the first detection signal of the at least one magnetic sensor when the magnetic field generation section is controlled to generate the at least one additional magnetic field and measuring the sensitivity of the at least one magnetic sensor on the basis of the data, the detection signal correction processing includes performing, on the first detection signal of the at least one magnetic sensor, processing for reducing a change component attributable to the at least one additional magnetic field, to generate at least one second detection signal that is a second discrete signal, and the sensitivity correction processing corrects the at least one second detection signal on the basis of measurement results of the sensitivity of the at least one magnetic sensor.

2. The magnetic sensor system according to claim 1, wherein the sensitivity measurement processing is performed when an activation condition is satisfied, the activation condition is that a predetermined period of time has elapsed since a last correction function determination processing, and the correction function determination processing is a processing to determine a correction function for correcting the at least one second detection signal on the basis of a measurement result of a sensitivity of the at least one magnetic sensor obtained by the sensitivity measurement processing.

3. The magnetic sensor system according to claim 1, wherein the sensitivity measurement processing is performed when an activation condition is satisfied, and the activation condition is that the first detection signal of the at least one magnetic sensor has a value in a nonlinear region.

4. The magnetic sensor system according to claim 1, wherein the sensitivity measurement processing is performed when an activation condition is satisfied, and the activation condition is that the first detection signal of the at least one magnetic sensor has a value outside a predetermined use range.

5. The magnetic sensor system according to claim 1, wherein the sensitivity measurement processing is performed when at least one of a first activation condition, a second activation condition, or a third activation condition is satisfied, the first activation condition is that a predetermined period of time has elapsed since a last correction function determination processing, the correction function determination processing is a processing to determine a correction function for correcting the at least one second detection signal on the basis of a measurement result of a sensitivity of the at least one magnetic sensor obtained by the sensitivity measurement processing, the second activation condition is that the first detection signal of the at least one magnetic sensor has a value in a nonlinear region, and the third activation condition is that the first detection signal of the at least one magnetic sensor has a value outside a predetermined use range.

6. The magnetic sensor system according to claim 1, wherein the detection signal correction processing includes performing processing for generating the at least one second detection signal by a calculation including subtracting an estimated value of the change component attributable to the at least one additional magnetic field from the first detection signal of the at least one magnetic sensor.

7. The magnetic sensor system according to claim 6, wherein the estimated value is discrete data, and the processing for generating the at least one second detection signal is processing for subtracting the estimated value from the first detection signal of the at least one magnetic sensor at each discrete time instant.

8. The magnetic sensor system according to claim 1, wherein the at least one additional magnetic field is at least one alternating-current magnetic field, the first detection signal of the at least one magnetic sensor contains an alternating-current change component attributable to the at least one additional magnetic field, and the detection signal correction processing generates the at least one second detection signal by performing filtering processing for reducing the change component on the first detection signal of the at least one magnetic sensor.

9. The magnetic sensor system according to claim 8, wherein the sampling frequency of the first detection signal of the at least one magnetic sensor is larger than a frequency of periodic changes in at least one additional magnetic field component, the at least one additional magnetic field component being a component of the at least one additional magnetic field that is applied to the at least one magnetic sensor when the at least one additional magnetic field is generated.

10. The magnetic sensor system according to claim 1, wherein the signal processing circuit is configured to correct the at least one second detection signal to generate at least one corrected signal and generate a detection value on the basis of the at least one corrected signal.

11. The magnetic sensor system according to claim 10, wherein the at least one magnetic sensor is one magnetic sensor, the at least one second detection signal includes one second detection signal generated from the first detection signal of the one magnetic sensor, the at least one corrected signal includes one corrected signal generated by correcting the one second detection signal, and the signal processing circuit is configured to convert the one corrected signal into the detection value on the basis of a predetermined correspondence between a value of the physical quantity and the one corrected signal.

12. A magnetic sensor system comprising:

at least one magnetic sensor configured to generate a first detection signal having a correspondence with a component in a predetermined direction of an external magnetic field;

an additional magnetic field generation section configured to generate at least one additional magnetic field for use in measuring a sensitivity of the at least one magnetic sensor; and a signal processing circuit configured to control the additional magnetic field generation section and process the first detection signal of the at least one magnetic sensor, wherein the signal processing circuit is configured to perform sensitivity measurement processing and detection signal correction processing, the sensitivity measurement processing includes obtaining data concerning a change in the first detection signal of the at least one magnetic sensor when the additional magnetic field generation section is controlled to generate the at least one additional magnetic field and measuring the sensitivity of the at least one magnetic sensor on the basis of the data, the detection signal correction processing includes performing, on the first detection signal of the at least one magnetic sensor, processing for reducing a change component attributable to the at least one additional magnetic field, to generate at least one second detection signal, the signal processing circuit is configured to use the at least one second detection signal to generate a detection value having a correspondence with a physical quantity to be detected, the sensitivity measurement processing is performed when an activation condition is satisfied, the activation condition is that a predetermined period of time has elapsed since a last correction function determination processing, and the correction function determination processing is a processing to determine a correction function for correcting the at least one second detection signal on the basis of a measurement result of a sensitivity of the at least one magnetic sensor obtained by the sensitivity measurement processing.

13. A magnetic sensor system comprising:

at least one magnetic sensor configured to generate a first detection signal having a correspondence with a component in a predetermined direction of an external magnetic field;

an additional magnetic field generation section configured to generate at least one additional magnetic field for use in measuring a sensitivity of the at least one magnetic sensor; and a signal processing circuit configured to control the additional magnetic field generation section and process the first detection signal of the at least one magnetic sensor, wherein the signal processing circuit is configured to perform sensitivity measurement processing and detection signal correction processing, the sensitivity measurement processing includes obtaining data concerning a change in the first detection signal of the at least one magnetic sensor when the additional magnetic field generation section is controlled to generate the at least one additional magnetic field and measuring the sensitivity of the at least one magnetic sensor on the basis of the data, the detection signal correction processing includes performing, on the first detection signal of the at least one magnetic sensor, processing for reducing a change component attributable to the at least one additional magnetic field, to thereby generate at least one second detection signal, the signal processing circuit is configured to use the at least one second detection signal to generate a detection value having a correspondence with a physical quantity to be detected, the sensitivity measurement processing is performed when at least one of a first activation condition, a second activation condition, or a third activation condition is satisfied, the first activation condition is that a predetermined period of time has elapsed since a last correction function determination processing, the correction function determination processing is a processing to determine a correction function for correcting the at least one second detection signal on the basis of a measurement result of a sensitivity of the at least one magnetic sensor obtained by the sensitivity measurement processing, the second activation condition is that the first detection signal of the at least one magnetic sensor has a value in a nonlinear region, and the third activation condition is that the first detection signal of the at least one magnetic sensor has a value outside a predefined use range.

* * * * *